US008940092B1

(12) United States Patent
Yeo et al.

(10) Patent No.: US 8,940,092 B1
(45) Date of Patent: Jan. 27, 2015

(54) HYBRID FIBERS, DEVICES USING HYBRID FIBERS, AND METHODS FOR MAKING HYBRID FIBERS

(71) Applicant: University of Washington through its Center for Commercialization, Seattle, WA (US)

(72) Inventors: Woon-Hong Yeo, Seattle, WA (US); Kieseok Oh, Seattle, WA (US); Kyong-Hoon Lee, Redmond, WA (US); Fong-Li Chou, Issaquh, WA (US); Jae-Hyun Chung, Bellevue, WA (US)

(73) Assignee: University of Washington through its Center for Commercialization, Seattle, WA (US)

( * ) Notice: Subject to any disclaimer, the term of this patent is extended or adjusted under 35 U.S.C. 154(b) by 20 days.

(21) Appl. No.: 13/627,169

(22) Filed: Sep. 26, 2012

Related U.S. Application Data

(62) Division of application No. 12/606,778, filed on Oct. 27, 2009, now abandoned.

(60) Provisional application No. 61/108,799, filed on Oct. 27, 2008.

(51) Int. Cl.
*C30B 7/12* (2006.01)

(52) U.S. Cl.
USPC ............... 117/68; 117/19; 117/22; 117/29; 435/91.5; 435/72; 530/300; 530/350; 536/23.1

(58) Field of Classification Search
None
See application file for complete search history.

(56) References Cited

U.S. PATENT DOCUMENTS

| | | |
|---|---|---|
| 6,280,590 B1 | 8/2001 | Cheng et al. |
| 6,479,644 B1 | 11/2002 | Bertling |
| 6,673,225 B1 | 1/2004 | Arnold et al. |
| 7,014,743 B2 | 3/2006 | Zhou |
| 7,818,065 B2 | 10/2010 | Llinas et al. |
| 7,976,616 B2 | 7/2011 | Alam |
| 8,632,669 B2 | 1/2014 | Chung et al. |
| 2002/0064795 A1 | 5/2002 | Hashimoto |
| 2003/0124572 A1 | 7/2003 | Umek et al. |
| 2003/0159932 A1 | 8/2003 | Betts et al. |
| 2004/0173378 A1 | 9/2004 | Zhou et al. |
| 2005/0059105 A1 | 3/2005 | Alocilja et al. |
| 2005/0070841 A1 | 3/2005 | Mathiesen et al. |
| 2006/0169589 A1 | 8/2006 | Takagi et al. |
| 2006/0213259 A1 | 9/2006 | Prinz et al. |
| 2007/0007142 A1* | 1/2007 | Zhou et al. ............ 205/78 |
| 2009/0297581 A1 | 12/2009 | Atanasoska et al. |

FOREIGN PATENT DOCUMENTS

| | | |
|---|---|---|
| CN | 1364940 | 8/2002 |
| CN | 101281202 | 10/2008 |
| JP | 7-23796 | 1/1995 |
| JP | 2000-515508 | 11/2000 |
| JP | 2003-88383 | 3/2003 |
| JP | 2006-61027 | 3/2006 |
| JP | 2006-513048 | 4/2006 |
| JP | 2006-246731 | 9/2006 |
| JP | 2007-319035 | 12/2007 |
| RU | 2423524 | 7/2011 |
| WO | 2008/094980 | 7/2008 |
| WO | 2009/149467 | 12/2009 |

OTHER PUBLICATIONS

Jung, et al., "Aligned Carbon Nanotube-Polymer Hybrid Architectures for Diverse Flexible Electronic Applications," Nano Letters, vol. 6, No. 3, pp. 413-418, (2006).
Kamat, et al., "Self-Assembled Linear Bundles of Single Wall Carbon Nanotubes and Their Alignment and Deposition as a Film in a dc Field," J. Am. Chem. Soc., 126, 9, pp. 10757-10762, (2004).
Kaul, et al., "Electromechanical Carbon Nanotube Switches for High-Frequency Applications," Nano Letters, vol. 6, No. 5, pp. 942-947, (2006).
Kim, et al., "Use of Dielectrophoresis in the Fabrication of an Atomic Force Microscope Tip With a Carbon Nanotube: Experimental Investigation," Nanotecnolgy, No. 17, pp. 2937-2941, (2006).
Kim, et al., "Use of Dielectrophoresis in the Fabrication of an Atomic Force Microscope Tip With a Carbon Nanotube: A Numerical Analysis," Nanotechnology, vol. 16, pp. 2245-2250, (2005).
Kong, et al., "Nanotube Molecular Wires as Chemical Sensors," Science, vol. 287, pp. 622-625, (2000).
Koratkar, et al., "Characterizing energy dissipation in single-walled carbon nanotube polycarbonate composites," Applied Physics Letter, vol. 87, pp. 063102-1-063102-3, (2005).
Krupke, "Thin Films of Metallic Carbon Nanotubes Prepared by Dielectrophoresis," Advanced Materials, vol. 18, pp. 1468-1470, (2006).
Krupke, et al, Contacting Single Bundles of Carbon Nanotubes With Alternating Electric Fields, Applied Physics, vol. A, No. 76, 397-400 (2003).
Krupke, et al., "Separation of Metallic from Semiconducting Single-Walled Carbon Nanotubes," Science, vol. 301, (2003).

(Continued)

*Primary Examiner* — Jim Ketter
(74) *Attorney, Agent, or Firm* — McDonnell Boehnen Hulbert & Berghoff LLP

(57) ABSTRACT

The present invention relates generally to nanocomposite materials. The present invention relates more particularly to hybrid fibers as well as devices including them and methods for making them. Accordingly, one aspect of the invention is a hybrid fiber including a plurality of nanowires, each nanowire having a length, a width, and a thickness, the length being at least 10 times the width and at least 10 times the thickness; and a plurality of binder elements, each binder element having a length, a width, and a thickness, each substantially smaller than the average length of the nanowires and at least one of which is less than about 10 nm in dimension, the binder elements being arranged to intercouple individual nanowires. In certain embodiments, the binder elements are carbon nanotubes, and the nanowires are formed from silicon carbide.

12 Claims, 21 Drawing Sheets

(56) References Cited

OTHER PUBLICATIONS

Krupke, et al. "Simultaneous Deposition of Metallic Bundles of Single-walled Carbon Nanotubes Using Ac-dielectrophoresis," Nano Letters, vol. 3, No. 8, 1019-1023, (2003).
Kumar, "High Resolution Shadowing of *Mycobacterium leprae*," Biotechnic and Histochemistry, vol. 79, pp. 197-201, (2004).
Lee, et al., "Fabrication and Crossed Junction of Semiconducting and Metalic Carbon Nanotubes: A CNT-Gated CNT-FET,", Journal of Nanoscience and Nanotechnology, vol. 6, pp. 1325-1330, (2006).
Lee, et al., "Nanoscale Fabrication of a Single Multiwalled Carbon Nanotube Attached Atomic Force Microscope Tip Using an Electric Field," Review of Scientific Instruments, vol. 76, pp. 046108-1-046108-5, (2005).
Lee, et al., "Superimposed AC- and DC Electric Field Guided Deposition of a Single DNA Molecule Along a Microfabricated Gap," IEEE, pp. 729-732, (2003).
Lee, et al., "The Effect of the Shape of a Tip's Apex on the Fabrication of an AFM Tip With an Attached Single Carbon Nanotube," Sensors and Actuators A, vol. 125, pp. 41-49, (2005).
Lewenstein, et al. "High-Yield Selective Placement of Carbon Nanotubes on Pre-Patterned Electrodes," Nano Letters, vol. 2, No. 5, pp. 443-446, (2002).
Li, et al, "Fabrication of Carbon Nanotube Field Effect Transistors by AC Dielectrophoresis Method," Carbon, 42, pp. 2263-2267, (2004).
Li, et al., "Silicon Nanowires for Sequence-specific DNA Sensing: Device Fabrication and Simulation," Appl. Phys. A, vol. 80, pp. 1257-1263, (2005).
Lin, et al., "Rolling-Circle Amplification of a DNA Nanojunction," Agnew Chem Int Ed, vol. 45, pp. 7537-7539, (2006).
Liu, et al, "Facile Preparation of Amperometric Laccase Biosensor With Multifunction Based on the Matrix of Carbon Nanotubes—Chitosan Composite," Biosensors and Bioelectronics, vol. 21, pp. 2195-2201, (2006).
Liu, et al, "Immersed Finite Element Method and Its Applications to Biological Systems," Comput Methods Appl Mech Eng., vol. 195, No. 13-16: pp. 1722-1749, (2006).
Liu, et al, "Manipulation of Nanoparticles and Biomolecules by Electric Field and Surface Tension," Comput. Methods Appl. Mech. Engineering., vol. 197, pp. 2156-2172, (2008).
Liu, et al., "Dielectrophoretic Assembly of Nanowires," J. Phys. Chem. B, No. 110, pp. 14098-14106, (2006).
Liu, et al., Immersed Electrokinetic Finite Element Method, International Journal for Numerical Methods in Engineering, vol. 71, pp. 379-405, (2007).
Liu, et al., "Quantitative Characterization of SWNT Orientation by Polarized Raman Spectroscopy," Chemical Physics Letters, vol. 378, pp. 257-262, (2003).
Liu, et al., "Rheology of Red Blood Cell Aggregation by Computer Simulation," Journal of Computational Physics, vol. 220, pp. 139-154, (2006).
Lu, et al., "Controlled deposition of Nanotubes on Opposing Electrodes," Nanotechnology, vol. 16, pp. 1765-1770, (2005).
Maruccio, et al., "Protein Conduction and Negative Differential Resistance in Large-Scale Nanojunction Arrays," Small, No. 7, pp. 1184-1188, (2007).
Maruyama, et al., "Characterization of Small-Diameter Carbon Nanotubes and Carbon Nanocaps on SiC(001) Using Raman Spectroscopy," Japanese Journal of Applied Physics, vol. 45, No. 9A, pp. 7231-7233, (2006).
Mayer, et al, "Calculation of the Electrostatic Forces That Act on Carbon Nanotubes Placed in the Vicinity of Metallic Protrusions," Nanotechnology, vol. 16, pp. 2685-2695, (2005).
McKay, et al., "Added-Mass Effect in Modeling of Cilia-Based (Vibrating Cantilever-Type) Devices for Microfluidic Systems," ASME, pp. 875-880, (2007).
Miller, et al, "Large-scale Assembly of Carbon Nanotubes," Nature, vol. 425, pp. 36-37, (2003).
Mota, et al, "Carbon Nanotube Adsorbed on a Hydrogenated Si-rich β-SiC (100( (3×2) Surface: First-Principles Pseudopotential Calculations," Physical Review B, vol. 74, pp. 165408-1-165408-5, (2006).

Mpourmpakis, et al., "SiC Nanotubes: A Novel Material for Hydrogen Storage," Nano Letters, vol. 6, No. 8, pp. 1581-1583, (2006).
Nilsson, et al., "Determination of the Thermal Diffusivity and Conductivity of Monocrystalline Silicon Carbide (300-2300 K)," ECTP Proceedings, vol. 29, pp. 73-79, (1997).
Oh, et al., Fluid Flow-Assisted Dielectrophoretic Assembly of Nanowires, Langmuir, vol. 23, pp. 11932-11940, (2007).
Oh, et al., "Fluid Manipulation by Bio-Mimetic Cilia", ASME, pp. 41-45, (2007).
Papadakis, et al., "Dielectrophoretic Assembly of Reversible and Irreversable Metal Nanowire Networks and Vertically Aligned Arrays," Applied Physics Letter, vol. 88, pp. 233118-1-233118-3, (2006).
Park, et al., "Aligned Single-Wall Carbon Nanotube Polymer Composites Using an Electric Field," Journal of Polymer Science: Part B: Polymer Physics, vol. 44, 1751-1762, (2006).
Park, et al., "Use of Dielectrophoresis in a High-Yield Fabrication of a Carbon Nanotube Tip," Japanese Journal of Applied Physics, vol. 44, No. 5A, pp. 3235-3239, (2005).
Patolsky, et al.,"Detection, Stimulation, and Inhibition of Neuronal Signals with High-Density Nanowire Transistor Arrays," Science, vol. 313, pp. 1100-1104, (2006).
Peng, et al.,"Three-dimentional Nanochannels Formed by Fast Etching of Polymer," Journal of Vacuum Science and Technology B, vol. 24, No. 4, pp. 1941-1946, (2006).
Rao, et al, "Polarized Raman Study of Aligned Multiwalled Carbon Nanotubes," Physical Review Letters, vol. 84, No. 8, pp. 1820-1823, (2000).
Saifullah, et al., "Sub-10-nm High Aspect Ratio Patterning of ZnO in a 500 μm Main Field," J. Vac. Sci. Technol. B., vol. 24, No. 3, pp. 1215-1218, (2006).
Saito, et al,, "Raman Intensity of Single-wall Carbon Nanotubes," Physical Review B, vol. 57, No. 7, pp. 4145-4153, (1998).
Sardone, et al., "Electric-Field-Assisted Alignment of Supramolecular Fibers," Advanced Materials, vol. 18, pp. 1276-1280, (2006).
Schadler, et al., "Load Transfer in Carbon Nanotube Epoxy Composites," Applied Physics Letters, vol. 73, No. 26, pp. 3842-3844, (1998).
Seo, et al, "Controlled Assembly of Single SWNTs Bundle Using Dielectrophoresis," Microeletonic Engineering, vol. 81, pp. 83-89, (2005).
Suehiro, et al. "Fabrication of a Carbon Nanotube-Based Gas Sensor Using Dielectrophoresis and Its Application for Ammonia Detection by Impedance Spectroscopy," j. PHys. D: Appl. PHys., vol. 36, pp. L109-L114, (2003).
Abraham, et al., "A Compact Wireless Gas Sensor Using a Carbon Nanotube/PMMA Thin Film Chemiresistor," Smart Materials and Structures, vol. 13, pp. 1045-1049, (2004).
Abrams, et al., "Tube-Tube and Tube-Surface Interactions in Straight Suspended Carbon Naotube Structures" School of Electrical Engineering, Tel-Aviv University, pp. 1-15, (2006).
Annamalai, et al. "Electrophoretic Drawing of Continuous Fibers of Single-walled Carbon Nanotubes," Journal of Applied Physics, vol. 98, pp. 114307-1-114307-6, (2005).
Bachtold, et al., "Logic Circuits with Carbon Nanotube Transistors," Science, vol. 294, pp. 1317-1320, (2001).
Baddour, et al., "Carbon Nanotube Synthesis: A Review," International Journal of Chemical Reactor Engineering, vol. 2, pp. 1-20, (2005).
Bai, "Shadow Edge Lithography for Nanoscale Patterning and Manufacturing," Nanotechnology, 18, 1-8, (2007).
Baierle, et al., Ab initio Study of Native Defects in SiC Nanotubes, Physical Review B, No. 74., 155425-1-155425-8, (2006).
Bangeree, et al., "Routes Towards Separating Metallic and Semiconducting Nanotubes," Journal of Nanoscience and Nanotechnology, vol. 5, pp. 841-855, (2005).
Bangerjee, et al. "Precise positioning of single-walled carbon nanotubes by ac dielectrophoresis," J. Vac. Sci. Technol. B, vol. 24, No. 6, pp. 3173-3178, (Nov./Dec. 2006).
Baughman, et al. "Carbon Nanotubes—the Route Toward Applications," Science, vol. 297, No. 99, pp. 787-792, (2002).
Cao, et al., "Multifunctional Brushes Made From Carbon Nanotubes," Nature Materials, vol. 4, pp. 540-545, (2005).

(56) References Cited

OTHER PUBLICATIONS

Chen, et al, "Fabrication of Nanoelectrodes Based on Controlled Placement of Carbon Nanotubes Using Alternating-Current Electric Field," J. Vac. Sci. Technol. B, vol. 22, No. 2, (2004).
Chen, et al., "Aligning Single-Wall Carbon Nanotubes With an Alternating-Current Electric Field," Applied Physics Letters, vol. 78, No. 23, pp. 3714-3716, (2001).
Cho, et al., "Carbon Nanotube Thin Film Coating for Improved Thermal Management in Piezoceramic Sheet Actuators," Journal of Intelligent Material Systems and Structures, vol. 17, No. 206, pp. 109-216, (2006).
Choi, et al, "Nanocrystalline TiO2 Photocatalytic Membranes with a Hierarchical Mesoporous Multilayer Structure: Synthesis, Haracterization, and Multifunction," Advanced Functional Materials, vol. 16, pp. 1067-1074, (2006).
Chung, et al., "Electric-Field-Driven Fluid Flow Around Nano Particles," ASME, pp. 457-461, (2004).
Chung, et al, "Nanoscale Gap Fabrication by Carbon Nanotube-Extracted Lithography (CEL)," Nano Letters, vol. 3, No. 8, pp. 1029-1031, (2003).
Chung, et al., "Integration of Single Multi-Walled Carbon Nanotube on Micro Systems," ASME, pp. 1-5, (2002).
Chung, et al., "Fabrication of Nanopores in a 100-nm Thick Si3N4 Membrane," Journal of Nanoscience and Nanotechnology, vol. 6, pp. 2175-2181, (2006).
Chung, et al., "Fabrication of Single Multi-walled Carbon Nanotube Array with a Composite Electric Field Guided Assembly Method," IEEE, pp. 331-334, (2003).
Chung, et al., "Microfabricated Glucose Sensor Based on Single-walled Carbon Nanotubes," IEEE, pp. 617-620, (2004).
Chung, et al., "Multi-Walled Carbon Nanotubes Experiencing Electrical Breakdown as Gas Sensors," Nanotechnology, 15, pp. 1596-1602, (2004).
Chung, et al., "Nanoscale Gap Fabrication and Integration of Carbon Nanotubes by Micromachining," Sensors and Actuators A, vol. 104, (2003).
Chung, et al., "Toward Large-Scale Integration of Carbon Nanotubes," Langmuir, vol. 20, pp. 3011-3017, (2004).
Chung, et al.,"Multi-walled Carbon Nanotube Sensors," IEEE, pp. 718-721, (2003).
Collins, et al, "Extreme Oxygen Sensitivity of Electronic Properties of Carbon Nanotubes," Science, vol. 287, pp. 1801-1804, (2000).
Collins, et al., "Nanotubes for Electronics," Scientific American, pp. 62-69, (2000).
Colussi, et al., "Silicon Adsorption in Single Walled Nanotubes," Brazilian Journal of Physics, vol. 36, No. 3B, pp. 886-889, (2003).
Dai, et al., "Probing Electrical Transport in Nanomaterials: Conductivity of Individual Carbon Nanotubes," Science, vol. 272, pp. 523-526, (1996).
Deusberg, et al, "Polarized Raman Spectroscopy on Isolated Single-Wall Carbon Nanotubes," Physical Review Letters, vol. 85, No. 25, (2000).
Dimaki, et al, "Waferscale assembly of Field-Aligned nanotube Networks (FANs)," Phys. Stat. Sol., vol. 203, No. 6, pp. 1088-1093, (2006).
Dimaki, et al., "Frequency Dependence of the Structure and Electrical Behaviour of Carbon Nanotube Networks Assembled by Dielectrophoresis," Nanotechnology, No. 16, pp. 759-763, (2005).
Dong, et al., "Dielectrophoretically Controlled Fabrication of Single-Crystal Nickel Silicide Nanowire Interconnects," Nano Letters, vol. 5, No. 10, pp. 2112-2115, (2005).
Li, et al., "Manipulation of carbon nanptubes using AC dielectrophoresis," Applied Physics Letters, 86: 153116 (2005).
Dong, et al., "Floating-Potential Dielectrophoresis-Controlled Fabrication of Single-Carbon-Nanotube, Transistors and Their Electrical Properties," J. Phys. Chem. B, vol. 109, pp. 13148-13153, (2005).
Dresselhaus, "Phonons in Carbon Nanotubes," Advances in Physics, vol. 49, No. 6, pp. 705-814, (2000).
Dresselhaus, et al., "Raman Spectroscopy on Isolated Single Wall Carbon Nanotubes," Carbon, 40, pp. 2043-2061, (2002).
Dresselhaus, et al., "Single Nanotube Raman Spectroscopy," Acc. Chem. Res., 35, pp. 1070-1078, (2002).
Duan, et al."Indium Phosphide Nanowires as Building Blocks for Nanoscale Electronic and Optoelectronic Device," Nature, vol. 409, pp. 66-69, (2001).
Ebbesen, et al., "Electrical Conductivity of Individual Carbon Nanotubes," Nature, vol. 382, pp. 54-56, (1996).
Englander, et al, "Electric-Field Assisted Growth and Self-Assembly of Intrinsic Silicon Nanowires," Nano Letters, vol. 5, No. 4, pp. 705-708, (2005).
Fan, et al, "Large-scale, Heterogeneous Integration of Nanowire Arrays for Image Sensor Circuitry," PNAS, vol. 105, No. 32, pp. 11066-11070, (2008).
Franklin, et al., "Integration of suspended carbon nanotube arrays into electronic devices and electromechanical systems," Applied Physics Letters, vol. 81, No. 5, pp. 913-915, (2002).
Frogley, et al., "Polarized Resonance Raman Spectroscopy of Single-Wall Carbon Nanotubes Within a Polymer Under Strain," Physical Review B, vol. 65, pp. 113413-1-113413-4, (2002).
Gommans, et al., "Fibers of Aligned Single-Walled Carbon Nanotubes: Polarized Raman Spectroscopy," Journal of Applied Physics, vol. 88, No. 5, pp. 2509-2514, (2000).
Hamers, et al, "Electrically Directed Assembly and Detection of Nanowire Bridges in Aqueous Media," Nanotechnology, vol. 17, pp. S280-S286, (2006).
Hou, et al., "Nonclassical Behavior in the Capacitance of a Nanojunction," Physical Review Letters, vol. 86, No. 23, 5321-5324 (2001).
Irle, et al., "Theory and Experiment Agree: Single-walled Carbon Nanotube Caps Grow Catalyst-free With Chirality Preference on a SiC Surface," The Journal of Chemical Physics, No. 125, pp. 044702-1-044702-5 (2006).
Javey, et al., "Carbon Nanotube Transistor Arrays for Multistage Complementary Logic and Ring Oscillators," Nano Letters, vol. 2, No. 9, pp. 929-932, (2002).
Suehiro, et al., "Application of Dielectrophoresis to Fabrication of Carbon Nanohorn Gas Sensor," Journal of Electrostatics, vol. 64, pp. 408-415, (2006).
Shim, et al., "Purification of Carbon Nanotubes Through an Electric Field Near the Arranged Microelectrodes," Nanotechnology, vol. 18, pp. 1-6, (2007).
Smith, et al., "Electric-Field Assisted Assembly and Alignment of Metallic Nanowires," Applied Physics Letters, vol. 77, No. 9, pp. 1399-1401, (2000).
Strus, et al., "Imaging Artefacts in Atomic Force Microscopy with Carbon Nanotube Tips," Nanotechnology, vol. 16, 2482-2492, (2005).
Suhr, et al, "Temperature-Activated Interfacial Friction Damping in Carbon Nanotube Polymer Composites," Nano Letters, vol. 6, No. 2, pp. 219-223, (2006).
Suhr, et al., "Effect of Pre-Strain on Interfacial Friction Damping in Carbon Nanotube Polymer Composites," Journal of Nanoscience and Nanotechnology, vol. 6, pp. 483-486, (2006).
Suhr, et al., "Viscoelasticity in Carbon Nanotube Composites," Nature Materials, vol. 4, pp. 134-137, (2005).
Taeger, et al., "Self-assembly of Carbon Nanotube Field-effect Transitors by AC-Dielectrophoresis," Phys. Stat. Sol., No. 13, pp. 3355-3358, (2006).
Takahashi, et al., "Aligning Vapor-Grown Carbon Fibers in Polydimethylsiloxane Using Dc Electric or Magnetic Field," Carbon, vol. 44, pp. 1180-1188, (2006).
Tang, "Rapid and Reproducible Fabrication of Carbon Nanotube AFM Probes by Dielectrophoresis," Nano Letters, vol. 5, No. 1, pp. 11-14, (2005).
Tang, et al., "Assembly of 1D Nanostructures Into Sub-micrometer Diameter Fibrils with Controlled and Variable Length by Dielectrophoresis," Advanced Materials, No. 15, pp. 1352-1355, (2003).
Thostenson, et al., "Aligned Multi-Walled Carbon Nanotube-Reinforced Composites: Processing and Mechanical Characterization," Institute of Physics Publishing, vol. 35, pp. L77-L80, (2002).
Veedu, et al., "Multifuctional Composites Using Reinforced Laminae with Carbon-Nanotube Forests," Nature Materials, vol. 5, pp. 457-462, (2006).

(56) References Cited

OTHER PUBLICATIONS

Wakaya, et al., "Fabrication of a Carbon Nanotube Device Using a Patterned Electrode and a Local Electric Field," Superlattices and Microstructures, vol. 34, pp. 401-405, (2003).

Wang, et al. "Controlled Assembly of Zinc Oxide Nanowires Using Dielectrophoresis," Applied Physics Letters, vol. 90, pp. 103110-1-103110-3, (2007).

Wang, et al., "Highly Polarized Photoluminescence and Photodetection from Single Indium Phosphide Nanowires," Science, vol. 293, pp. 1455-1457, (2007).

Wang, et al., "Rapid, Low Temperature Microwave Synthesis of Novel Carbon Nanotube—Silicon Carbide Composite," Carbon, vol. 44, pp. 2804-2808, (2006).

Wood, et al., "Orientation of Carbon Nanotubes in Polymers and Its Detection by Raman Spectroscopy," Composites: Part A, vol. 32; pp. 391-399, (2001).

Yamamoto, et al., "Orientation and Purification of Carbon Nanotubes Using AC Electrophoresis," J. Phys. D. Appl. Phys., vol. 31, pp. L34-L36, (1998).

Yeo, et al. "Hybrid Fiber Fabrication Using an AC Electric Field and Capillary Action," ASME, pp. 267-272, (2007).

Zhang, et al., "All-around Contact for Carbon Nanotube Field-effect Transistors Made by AC Dielectrophoresis," Journal of Vacuum Science and Technology B, vol. 24, No. 1, pp. 131-135, (2006).

Zhang, et al., "Alternating Current Dielectrophoresis of Carbon Nanotubes," Journal of Applied Physics, vol. 98, pp. 056103-1-056103-3, (2005).

Zhang, et al., "Fabrication of InAs quantum dots in AlAs/GaAs DBR pillar microcavities for single photon sources," Journal of Applied Physics, vol. 97, pp. 073507-1-073507-7 (2005).

Suhr, et al., "Fatigue resistance of aligned carbon nanotube arrays under cyclic compression," Nature Nanotechnology, 2:417(2007).

Zhang, et al., "Multifunctional Carbon Nanotube Yarns by Downsizing an Ancient Technology," Science, vol. 306, pp. 1358-1361, (2004).

Zhang, et al., "Observation of High Buckling Stability in Carbon Nanotube Polymer Composites," Advanced Materials, vol. 18, pp. 452-456, (2006).

Zhang, et al., "Substrate-Site Selective Growth of Aligned Carbon Nanotubes," Applied Physics Letters, vol. 77, No. 23, pp. 3764-3766, (2000).

Zhou, et al., "Simple Fabrication of Molecular Circuits by Shadow Mask Evaporation," Nano Letters, vol. 3, No. 10, pp. 1371-1374, (2003).

Suehiro, et al., "Schottky-type response of carbon nanotube NO2 gas sensor fabricated onto aluminum electrodes by dielectrophoresis," Sensors and Actuators, B 114(2006): 943-949.

International Search Report for PCT/US09/46652, mailed Feb. 17, 2010.

Japanese Office Action received Mar. 28, 2013, issued in corresponding Japanese Patent Application No. 2011-512751, filed Jun. 8, 2009.

Notifcation of the Third Office Action mailed Jun. 27, 2013, issued in corresponding Chinese Application No. 2009801275723, filed Jun. 8, 2009.

Notifcation of the Second Office Action mailed Feb. 28, 2013, issued in corresponding Chinese Application No. 2009801275723, filed Jun. 8, 2009.

International Search Report for PCT/US2013/027683, mailed Jul. 11, 2013.

\* cited by examiner (a)

(b)

(a)

(b)

US 8,940,092 B1

HYBRID FIBERS, DEVICES USING HYBRID FIBERS, AND METHODS FOR MAKING HYBRID FIBERS

CROSS-REFERENCE TO RELATED APPLICATIONS

This application is a Divisional application of U.S. Utility application Ser. No. 12/606,778, filed on Oct. 27, 2009 which claims priority to U.S. Provisional Patent Application Ser. No. 61/108,799 filed on Oct. 27, 2008, which is hereby incorporated by reference in its entirety.

STATEMENT OF GOVERNMENT LICENSE RIGHTS

This invention was made with Government support under grant number 0740525 awarded by the National Science Foundation. The Government has certain rights in this invention.

BACKGROUND OF THE INVENTION

1. Field of the Invention

The present invention relates generally to nanocomposite materials. The present invention relates more particularly to hybrid fibers as well as devices including them and methods for making them.

2. Technical Background

The interest in multifunctional materials is driven by recent trends in engineering industries. Multifunctional materials aim to perform two or more functions simultaneously. For example, a multifunctional material desirable for use as an airplane fuselage is capable of bearing a large structural load, as well as of carrying electrical current to disperse lightning and static electricity. Multifunctional materials are especially demanded in aerospace vehicles, space applications, and electro-mechanical systems. For example, nanowire-based field-effect transistor, logic circuit and electromechanical switching devices have recently been developed. As a result, there have recently been broad efforts directed toward providing multifunctional nanocomposite materials. These nanocomposite materials can demonstrate excellent properties as a result of the interface between different domains (e.g., filler and matrix material in a composite). This provides an opportunity to effectively tailor the properties of the materials by manipulating the interfacial characteristics through chemical- or physical surface treatments.

In particular, carbon nanotube additives have been successfully used to engineer the mechanical, electrical and thermal properties of nanocomposite materials. Carbon nanotubes have been used, for example, to improve the mechanical performance of lightweight composite materials. Carbon nanotube-based nanocomposites have demonstrated strong potential for multifunctional material systems.

DETAILED DESCRIPTION OF THE INVENTION

While multifunctional materials are of potentially high value, they are often very difficult to fabricate. Dispersal of nanomaterials in a matrix can be a time-consuming process. Carbon nanotube/polymer composites can be fabricated, for example, by infiltrating polymer matrix materials into vertically aligned multi walled carbon nanotubes grown on a pre-patterned $SiO_2$ substrate. While this fabrication process avoids the tedious dispersion process, bulk structures are difficult to fabricate in this way because of difficulties in growing carbon nanotubes over a centimeter in length. Until now, only millimeter-long multiple wall carbon nanotubes have been grown by the chemical vapor deposition method. To best utilize the carbon nanotubes as filler materials, a new technique is desirable to manufacture carbon nanotube-containing fibers, which can be used similar to carbon fibers in a traditional composite.

One aspect of the invention is a hybrid fiber comprising a plurality of nanowires, each nanowire having a length, a width, and a thickness, the length being at least 10 times the width and at least 10 times the thickness; and a plurality of binder elements, each binder element having a length, a width, and a thickness, each substantially smaller than the average length of the nanowires and at least one of which is less than about 10 nm in dimension, the binder elements being arranged to intercouple individual nanowires.

As used herein, a "nanowire" is a generally rod-shaped piece of material, up to 100 μm in length (i.e., in its longest direction), and less than 1 μm in width and in thickness. It can have virtually any cross-sectional shape, and can be, for example, substantially solid, or hollow (i.e., a "nanotube"). A nanowire can be formed from virtually any material, as described in more detail below.

Figure 1:
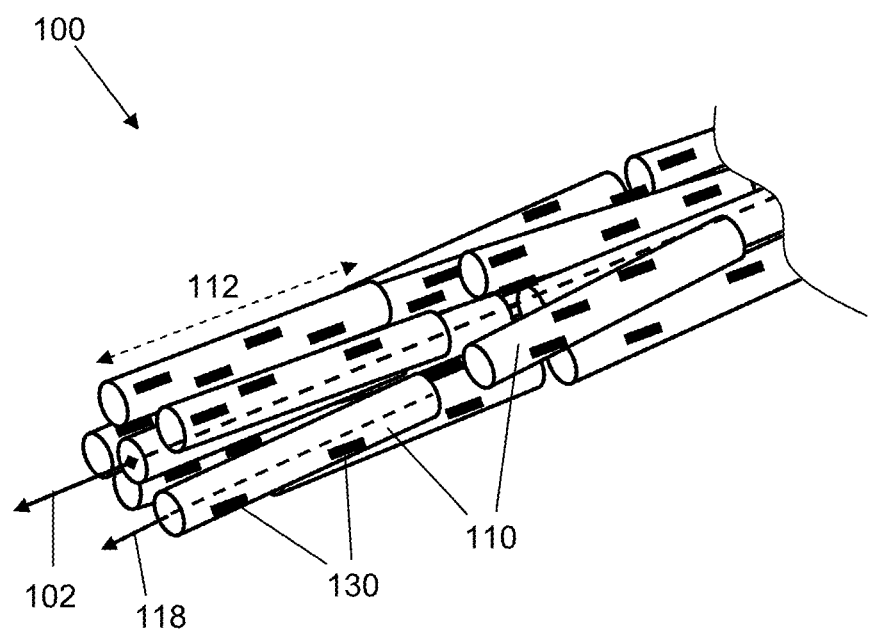
FIG. 1 is a schematic perspective view of a hybrid fiber according to one embodiment of the invention.
Figure 2:
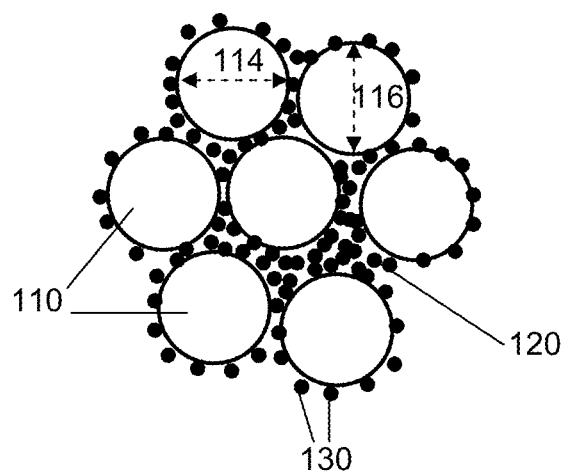
FIG. 2 is a schematic cross-sectional view of the hybrid fiber of FIG. 1.

A schematic perspective view of a hybrid fiber according to one embodiment of the invention is provided as FIG. 1. A schematic cross-sectional view of the hybrid fiber of FIG. 1 is provided as FIG. 2. Hybrid fiber 100 has a major axis 102, which denotes the overall directionality of the hybrid fiber. Hybrid fiber 100 is formed from a plurality of nanowires 110, arranged along the major axis 102. Each nanowire has a length 112, a width 114 and a thickness 116, with the length being at least 10 times the width and at least 10 times the thickness. In this embodiment, the nanowires are arranged along the major axis 102, so that their axes along their lengths 118 are within 30 degrees of parallel to one another. For example, the nanowires can be arranged so that their axes along their lengths are within 15 degrees of parallel to major axis 102. Hybrid fiber 100 also includes a plurality of binder elements 120, each having a length, a width and a thickness, each of which is substantially smaller than the average length of the nanowires. At least one of the length, width and thickness of each binder elements is less than 10 nm in dimension. As shown in FIGS. 1 and 2, the binder elements are arranged to intercouple individual nanowires. Additional binder elements (130) can also be located on the surfaces of the nanowire (i.e., not intercoupling multiple nanowires).

Due to their small size (less than 10 nm) in at least one dimension, the binder elements have very high surface area per unit volume, and therefore a very high surface energy. Without intending to be limited to any particular theory of operation, the inventors surmise that the high surface energy binder elements act to hold together adjacent nanowires through non-specific binding forces (e.g., van der Waals forces). Accordingly, the nanowires provide a structural framework for the hybrid fiber, and the binder elements hold that structural framework together. Additional binder elements can similarly attach to the surfaces of the nanowires through non-specific binding interactions. A close-up SEM of two SiC nanowires intercoupled by a network of single walled carbon nanotubes is provided in FIG. 3.

The nanowires can be formed from, for example, silicon carbide, carbon, oxides such as zinc oxide, silicon dioxide or titanium dioxide, semiconductor materials such as doped or undoped silicon, III-V semiconductors, and II-VI semiconductors, other inorganic materials, or organic materials such as polymeric materials. In one embodiment, the nanowires are formed from silicon carbide.

Notably, the nanowires can provide a variety of desired functionalities to the hybrid fiber. For example, in certain embodiments, nanowires can be formed from a material that is electrically conductive, thermally conductive (e.g., SiC), photoelectric (e.g., InP or TiO2), piezoresistive (e.g., GaAs), piezoelectric (e.g., PZT), semiconducting (e.g., doped Si) or ferromagnetic (e.g., $Fe_2O_3$).

The nanowires can be of a wide variety of lengths. In certain embodiments, the nanowires have an average length of at least about 100 nm, at least about 1 μm, or even at least about 10 μm. In certain embodiments, the nanowires have an average length of less than about 500 μm, or even less than about 100 μm. Relatively longer nanowires can allow the formation of longer hybrid fibers and the use of higher throughput processes in hybrid fiber manufacture. In certain embodiments, the nanowires have cross-sectional dimensions in the range of 10 nm-1 μm. For example, in one embodiment, the nanowires can have cross-sectional dimensions in the range of 100 nm-800 nm.

In certain embodiments, the nanowires include two or more different types of nanowires, each type having a different size, being formed from a different material, or both. The person of skill in the art can mix together different types of nanowires to provide the hybrid fiber formed therefrom with a desired set of properties.

As described above, the binder elements are nanoscale materials (i.e., each binder element has at least one of its length, width and thickness less than 10 nm in dimension). For example, the binder elements can be so-called "0D" nanomaterials, with all three of their length, thickness and width less than 10 nm in dimension. In other embodiments, the binder elements can be "1D" nanomaterials (i.e., rod-shaped), in which the width and thickness of each of the binder elements is less than 10 nm in dimension, and the average length of each of the binder elements is greater than 10 nm in dimension. In other embodiments, the binder elements can be "2D" nanomaterials (i.e., plate-shaped), in which wherein the thickness of each of the binder elements is less than 10 nm in dimension, and the average length and width of each of the binder elements is greater than 10 nm in dimension. Of course, the hybrid fiber can include a combination of binder elements.

The binder elements can be formed from a wide variety of materials. For example, in one embodiment, the binder elements include carbon nanotubes (e.g., single-walled carbon nanotubes or multiple-wall carbon nanotubes); carbon nanoparticles (e.g., $C_{60}$ and other fullerenes), graphene, or combinations thereof. In other embodiments, the binder elements include biological or biomolecular species such as viruses, nucleic acids, peptides, polysaccharides, polyphenols, polylipids, cells, or combinations thereof. The biomolecular species can be, for example, a biomarker. In certain embodiments, the binder elements include a combination of carbon nanotubes, carbon nanoparticles or graphene; and nucleic acids, peptides, viruses, polysaccharides, polyphenols, polylipids, cells. Of course, the person of skill in the art would recognize in light of the present disclosure that other nanoscale binder elements can be used in practicing the invention. For example, binder elements can be formed from silicon carbide, carbon, oxides such as zinc oxide, silicon dioxide or titanium dioxide, semiconductor materials such as doped or undoped silicon, III-V semiconductors, and II-VI semiconductors, other inorganic materials, or organic materials such as polymeric materials.

Notably, the binder elements can provide a variety of desired functionalities to the hybrid fiber. For example, in certain embodiments, the binder elements are electrically conductive (e.g., more electrically conductive than the nanowires). For example, when the nanowires are formed form silicon carbide, and the binder elements are carbon nanotubes, the carbon nanotubes can provide increased electrical conductivity to the hybrid fiber. In other embodiments, the binder elements can be more electrically polarizable than the nanowires.

In certain embodiments, the binder elements are formed from a material that is thermally conductive (e.g., SiC), photoelectric (e.g., InP or TiO2), piezoresistive (e.g., GaAs), piezoelectric (e.g., PZT), semiconducting (e.g., doped Si) or ferromagnetic (e.g., $Fe_2O_3$).

In certain embodiments, the binder elements have at least one of their length, width and thickness less than about 3 nm in dimension. Such binder elements can have an especially high surface-to-volume ratio, and therefore exhibit especially high non-specific binding to the nanowires. For example, the binder elements can be single-walled carbon nanotubes.

In certain embodiments, the binder elements include two or more different types of nanowires, each type having a different size, being formed from a different material, or both. The person of skill in the art can mix together different types of binder elements to provide the hybrid fiber formed therefrom with a desired set of properties.

The person of skill in the art can balance the properties of the binder elements and the nanowires, as well as their relative proportions, to achieve desired properties in the hybrid fiber. As described above, the nanowires can be formed from a single material, or in some embodiments, a plurality of different types of nanowires (e.g., formed from a plurality of materials) can be used. Similarly, all the binder elements can be substantially the same, or in other embodiments a plurality of different types of nanowires (e.g., substantially different in dimension or material) can be used.

In certain embodiments, the hybrid fibers are predominantly formed from the nanowires and the binder elements. For example, in certain embodiments, at least about 75%, at least about 90%, or even at least about 98% of the mass of the hybrid fiber comes from nanowires and binder elements. In certain embodiments, the hybrid fibers consist essentially of the binder elements and the nanowires.

In one embodiment of the invention, the nanowires are formed from silicon carbide and the binder elements are single-walled carbon nanotubes. Such an embodiment is described in more detail in Example 1, below. In another embodiment of the invention, the nanowires are formed from silicon carbide, and the binder elements are a mixture of single walled carbon nanotubes and DNA. Such an embodiment is described in more detail in Example 2, below.

Figure 3:
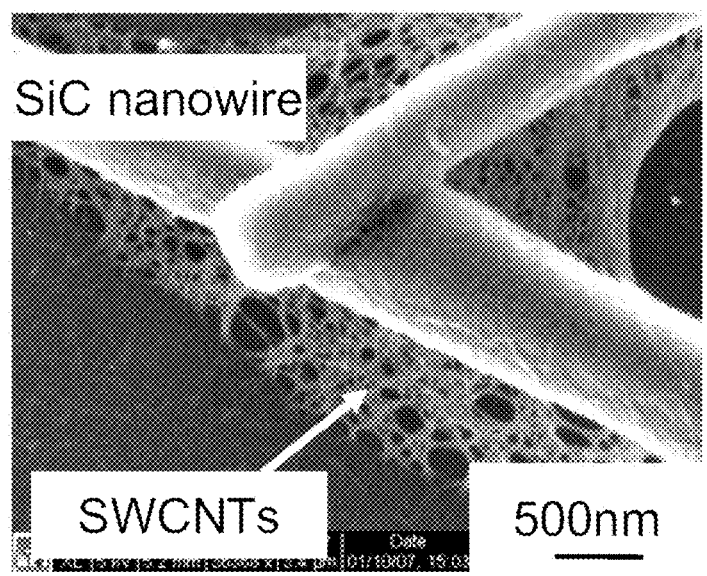
FIG. 3 is an SEM micrograph of two SiC nanowires intercoupled with single walled carbon nanotubes.

As described above, binder elements can not only intercouple the nanowires, but also be disposed on the surfaces of the nanowires. Binder elements tend to have high surface energy, and can therefore bind to any lower energy surface, such as that of the nanowires. For example, when the binder elements include nucleic acids, proteins, or other small biological particles, they can be disposed along the surfaces of the nanowires. The SEM of FIG. 3 shows single walled carbon nanotubes disposed along the sides of the SiC nanowires, not just intercoupling adjacent nanowires.

In certain embodiments, the hybrid fiber can be made to be less than 100 μm in length (i.e., a "hybrid fibril"). In other embodiments, they hybrid fiber can be made to be more than 100 μm (e.g., at least 1 mm, or even at least 1 cm) in length.

Another aspect of the invention is a method for preparing the hybrid fibers described herein. The method generally comprises inserting a tip into a surface of a suspension of the nanowires and the binder elements in a solvent; and drawing the tip from the surface of the suspension, thereby pulling the hybrid fiber from the suspension. The hybrid fibers, nanowires and binder elements can be, for example, as described herein.

As used herein, a "suspension" is a mixture of one or more materials with a solvent. The materials can be dissolved in the solvent (i.e., a solution), or merely suspended in the solvent.

Figure 4:
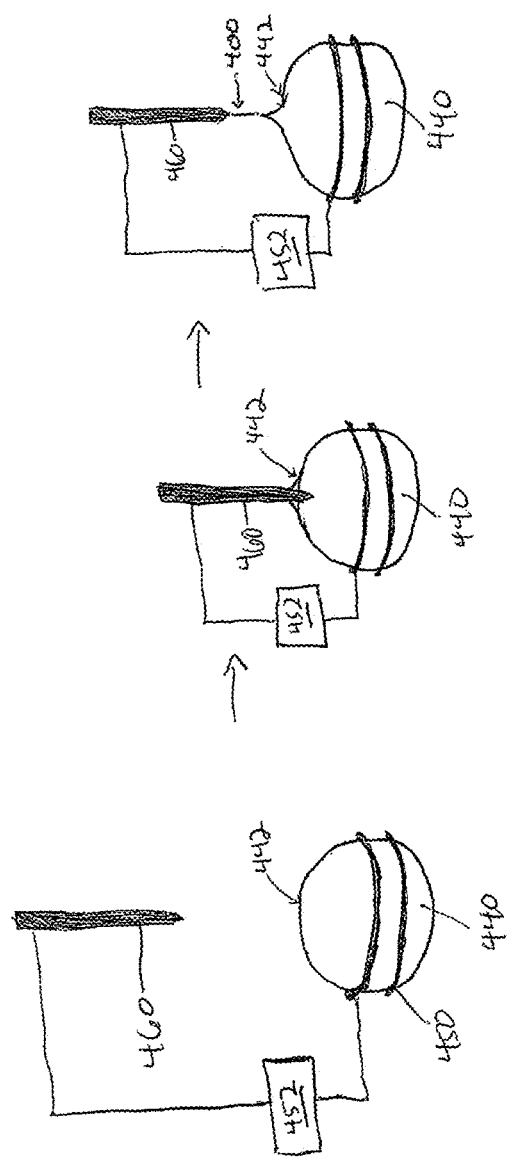
FIG. 4 is a schematic view of a method according to one embodiment of the invention.

One embodiment of the invention is shown in schematic view in FIG. 4. In this embodiment, a droplet 440 of a suspension of nanowires and binder elements is contained within one or more electrodes 450, in this example, a small coil of wire. A conductive tip 460 (made, for example, of tungsten) is disposed above the surface 442 of the droplet 440. The tip 460 is inserted into the surface 442 of the droplet 440, and an electrical potential is provided between the tip 460 and the one or more electrodes 450, for example using a function generator 452. The electrical potential can be, for example, a DC potential, an AC potential, or a combination of the two. In certain embodiments, for example, the electrical potential is an AC potential. Without intending to be bound by theory, the inventors surmise that the AC potential causes a dielectrophoretic force which attracts nanowires and binder elements to the tip and partially aligns them with the electric field generated by the electric potential. The tip 460 is then withdrawn from the surface 442 of the droplet 440, drawing with it the attracted nanowires and binder elements, and thereby growing the hybrid fiber 400. Without intending to be bound by theory, the inventors surmise that surface tension at the surface of the droplet (i.e., at the growing end of the hybrid fiber) causes nanowires to tend to be rotated normal to the surface. Moreover, the inventors surmise that capillary action causes the collected materials to collapse together and to stick to the tip, forming the solid hybrid fiber and further providing alignment to the nanowires. As the tip is pulled further from the surface of the droplet, the already-grown hybrid fiber (when electrically conductive) can maintain the electric potential between the growing end of the hybrid fiber and the one or more electrodes.

The electrical potential used will depend on the properties of the nanowires and the binder elements, as well as on the characteristics of the tip and the one or more electrodes. The electrical potential can include, for example, an AC potential. An AC potential generates a dielectrophoretic force, which can attract and orient rod-shaped objects in suspension. Moreover, an AC field can be used to improve the electrical conductance of the hybrid fiber, as relatively more metallic binder elements will be preferentially attracted to the tip. An AC field can also tend to attract certain types of nanowires and binder elements (e.g., carbon nanotubes and rod-shaped nanowires) over unwanted particles. For example, in certain embodiments, the electrical potential is an AC potential having a peak-to-peak voltage in the range of 10-50 $V_{pp}$, and a frequency in the range of 0.1-50 MHz. In some embodiments, the electrical potential can include a DC potential. A DC field can generate an electrophoretic force, which can be used to preferentially attract charged particles to the tip. For example, a DC field can preferentially attract single walled carbon nanotubes to a positively-charged tip, due to the presence of carboxylate moieties on the single walled carbon nanotubes. This can help to conserve material by avoiding the unwanted deposition of carbon nanotubes on the negative electrode. A DC field can also be advantageous in that it can maintain a constant current by feedback control, which can help to improve the uniformity of the hybrid fiber diameter. However, a pure DC field in some circumstances may not provide the same alignment and purification benefits described above with respect to the AC field. In certain embodiments, the electrical potential includes both AC potential and DC potential. The person of skill in the art can balance the effects of electrophoresis and dielectrophoresis. For example, when the ratio of DC field strength to AC field strength is about 0.4, both effects are present and can influence the growth of the hybrid fiber. Using a composite potential can increase the approaching velocity of nanowires to the (positively charged) tip, thereby allowing a relatively faster withdrawal rate.

Figure 5:
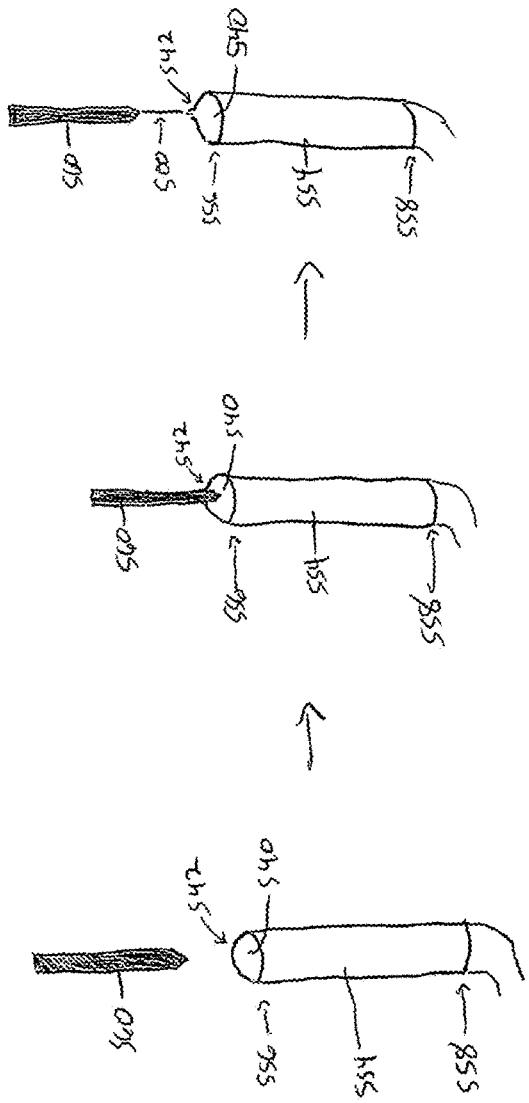
FIG. 5 is a schematic view of a method according to another embodiment of the invention.

Another embodiment of the invention shown in schematic view in FIG. 5. In this embodiment, the suspension 540 of nanowires and binder elements is provided in a tube 554 having a first end 556. The suspension protrudes from the first end of the tube, forming a surface 542. A tip 560 is inserted into the surface 542. Without intending to be bound by theory, the inventors surmise that surface tension at the surface of the droplet (i.e., at the growing end of the hybrid fiber) causes nanowires to tend to be rotated normal to the surface. Moreover, the inventors surmise that evaporation of the solvent at the surface of the suspension causes nanowires and binder elements to deposit on the surface of the tip. The tip 560 is then drawn from the surface 542, thereby forming the hybrid fiber 500. Without intending to be bound by theory, the inventors surmise that capillary action causes the collected materials to collapse together, forming the solid hybrid fiber and further providing alignment to the nanowires. As the suspension evaporates, it is replenished by pumping from a second end 558 of the tube (e.g., with a syringe pump, not shown). The evaporation of the solvent can be controlled by the person of skill in the art (e.g., with temperature, selection of solvent, and vapor pressure of solvent in the atmosphere) to provide rate of evaporation that balances with the desired drawing speed. This method can be advantageous in that it can constantly replenish the suspension, so that the length of the hybrid fiber is not limited by the initial volume of a droplet of suspension. Moreover, this method does not require the use of an electric field, and can therefore provide a long hybrid fiber made of non-conductive materials. Of course, as the person of skill in the art will appreciate, one or more electrodes can be positioned at the first end of the tube, so that an electric field can be used as described herein.

The choice of solvent used in the methods of the present invention will depend on a number of factors, including the identities of the nanowires and the binder elements, and rate of hybrid fiber drawing. For example, in certain embodiments the solvent is N,N-dimethylformamide.

The withdrawal rate will depend on a number of factors, including the identities of the nanowires and binder elements, the nanowire length and desired hybrid fiber thickness. The withdrawal rate can be, for example, in the range of 1 µm/s to 100 µm/s. In certain embodiments, the withdrawal rate is in the range of 10 µm/s to 50 µm/s.

In certain embodiments, a period of time is allowed to elapse between the inserting of the tip into the surface of the suspension and the drawing of the tip. The elapsed time can, for example, allow the nanowires and the hybrid fibers to be attracted to the tip (e.g., by dielectrophoresis or evaporation/capillary action), so that the materials stick to the tip as it is withdrawn from the surface of the suspension. For example, in certain embodiments, at least one minute, at least five minutes, or even at least ten minutes are allowed to elapse between the inserting of the tip and the drawing of the tip.

Hybrid fibers can be post-processed to improve their properties. For example, in certain embodiments, the hybrid fibers can be annealed after formation (e.g., at 300° C. for 5 minutes, after being air dried).

The various process parameters can be used by the person of skill in the art to control final fiber properties. For example, as described in more detail with respect to the Examples, below, the ratio between nanowires and binder elements can be used to control the mechanical stiffness, electrical conductance and length of the hybrid fiber. The overall concentration of the suspension as well as the immersion time before drawing can be used to control the overall length and diameter of the hybrid fiber. The withdrawal rate can be balanced against these parameters to provide relatively high production rates of hybrid fibers. The volume of the suspension from which the hybrid fiber is drawn will place an upper limit on the length of the fiber. Use of an electric field can help to preferentially incorporate rod-shaped nanowires and binder elements over particulate species in the suspension, and can increase the electrical conductivity of the hybrid fiber due to selective attraction of more metallic species.

An array of hybrid fibers can be fabricated using a device with an array of tips. It is important to minimize the effects of mechanical and electrical interference between neighboring tips. For example, mechanical interference can occur when two neighboring tips are close enough so that the meniscus in the neighborhood of one tip is perturbed by the meniscus in the neighborhood of the other tip. In DMF suspension with tungsten tips, for example, a 300 µm distance between tips is sufficient to avoid mechanical interference. In methods using electrical potentials, separation of about 500 µm or more is desirable to avoid electrical interference.

Figure 6:
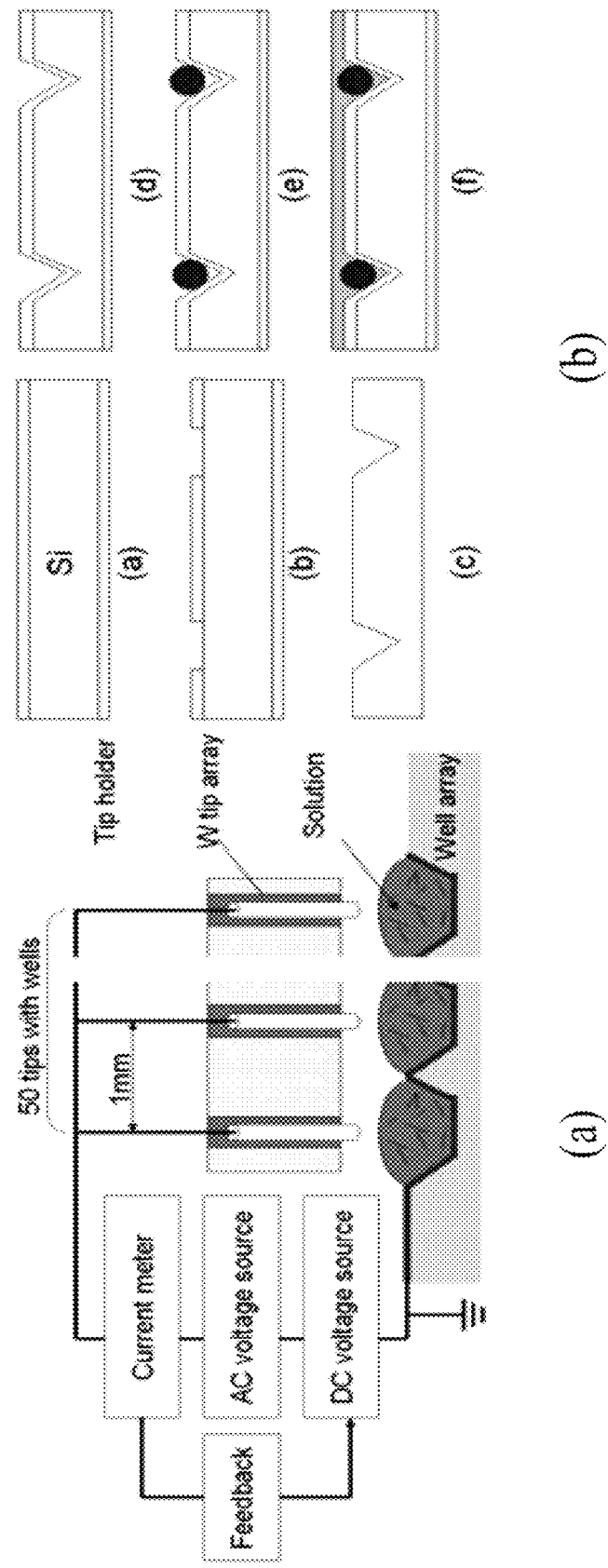
FIG. 6 is a schematic view of a hybrid fiber array fabrication setup.

One example of a hybrid fiber array fabrication setup is shown in schematic view in FIG. 6. A tip holder is prepared as shown in FIG. 6(*b*). KOH etching of a patterned (with silicon nitride) silicon wafer is performed to create an array of V-grooves with 1 mm spacing. The nitride is removed in HF solution, and the bare silicon V-groove wafer was thermally oxidized to grow a 1 µm thick oxide layer. If necessary, gold can be evaporated on the oxide layer to improve electrical conductivity. After aligning tungsten tips in the V-grooves, the tip holder 670 is covered with glass and PDMS. Turning to FIG. 6(*a*), an array of wells 672 is fabricated in an aluminum block by drilling. The tips are aligned with the wells using a microscope. The tips can then be immersed in the suspension (e.g., with application of an electric field), and withdrawing using a linear motor to form the array of fibers.

Another aspect of the invention is a device comprising one or more hybrid fibers as described herein.

For example, in one embodiment, the hybrid fiber is configured as a tip for a microscopy or lithography tool. The hybrid fiber can, for example, be grown from a microtip (e.g., made of tungsten), and used as a nanotip (i.e., a tip having a diameter less than one µm in dimension) in atomic force microscopy, scanning tunneling microscopy or scanning probe microscopy applications. In other embodiments, the hybrid fiber is configured as a tip for electron emission or photon emission. In such embodiments, the hybrid fiber can be a hybrid fibril (i.e., less than 100 µm in length).

In another embodiment, the hybrid fiber is configured as a collector that collects particles (e.g., biological particles such as nucleic acids, proteins, cells and viruses) in a size-specific manner. The hybrid fiber can be configured as an electrode; when immersed in a liquid, electric field-induced forces can urge particles toward the hybrid fiber. When the particles are in close proximity to (e.g., in contact with) the hybrid fiber electrode, it is withdrawn from the liquid and capillary forces formed between the withdrawing hybrid fiber electrode and the surface of the liquid immobilize the particles on the hybrid fiber electrode. The size of particles concentrated will depend on the size of the hybrid fiber electrode; particles on the order of the size of the hybrid fiber electrode and smaller will generally be collected, and much larger particles will not. As the person of skill in the art can control the size of the free end of the hybrid fiber electrode, the size of the collected particles can therefore be controlled. The collected particles are concentrated more densely on the electrode than in suspension, and therefore analysis of the particles (e.g., by fluorescence spectroscopy) can be improved. Amounts of collected particles can be determined by measuring a change in conductivity of the hybrid fiber electrode.

Moreover, the concentrated particles can be further manipulated. For example, the particles can be removed from the hybrid fiber electrode (e.g., especially when the hybrid fiber electrode is coated with a release layer such as poly (dimethylsiloxane)) and stored for further use or introduced into a second liquid (e.g., a cell).

This method can be used, for example, to collect DNA from aqueous samples (e.g., samples containing extracellular DNA as well as whole cells). Use of a hybrid fiber electrode to collect DNA from an aqueous sample is described in Example 4, below. Collected DNA can be used as a specific probe in testing some other sample, or the method can be used diagnostically to identify the presence of an organism (e.g., bacteria, fungi, protozoa, virus, etc.) in an aqueous sample of interest, including but not limited to bodily fluids (e.g., serum, urine, sputum, saliva, etc.), environmental sample (e.g., waste water, agricultural run-off, etc.), and fluids for consumption (e.g., drinking water, milk, etc.). In a specific example, the method can be used to detect tuberculosis in human sputum by concentrating the tuberculosis bacteria on a hybrid fiber electrode then analyzing them with fluorescence spectroscopy.

In another embodiment, the hybrid fiber is used as a nanofibrous scaffold for in-vivo tissue growth and/or engineering. In one non-limiting embodiment, the hybrid fiber is fabricated to recreate the structural anisotropy typical of fiber-reinforced tissues, including but not limited to tendons, ligaments, cartilage, meniscus, and annulus fibrosus. In a further non-limiting example, the hybrid fibers of the invention are used to produce fiber-reinforced, biodegradable tissue scaffolds whose fibrous supports are oriented predominantly in a single direction. The scaffold may be injected or implanted into humans or animals to provide support for physiological loads applied parallel to the predominant direction of orientation of the fibers. The orientation of the fibers also causes the mechanical properties of the scaffold to be anisotropic, i.e., the higher strengths provided by the fibers is maximal in the direction parallel to the fibers, thus providing primary support for physiological loads where they are highest. In certain such embodiments, the hybrid fiber includes a plurality of biomolecules (e.g., as the binder elements).

Figure 7:
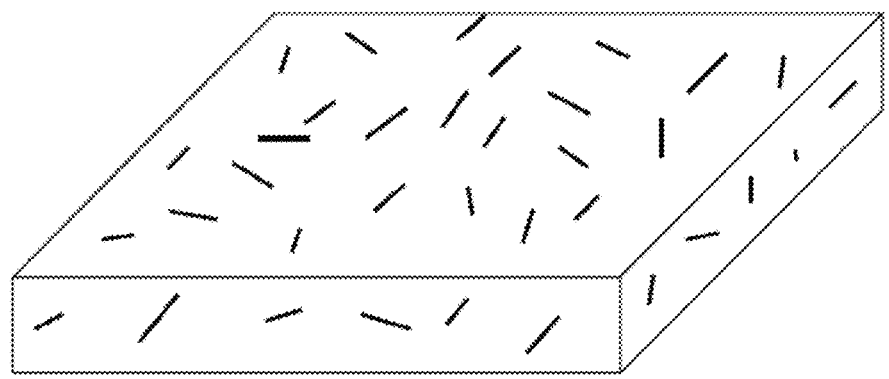
FIG. 7 is a set of schematic perspective views of two composite materials according to the present invention.
Figure 7:
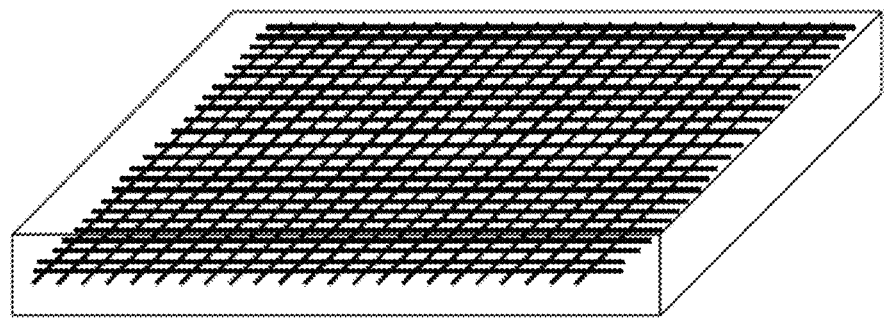

Another aspect of the invention is a composite material comprising a plurality of hybrid fibers as described herein, embedded in a material. For example, FIG. 7(a) shows a composite material 780 comprising a plurality of hybrid fibers 700 as described herein embedded in a material 782. The material can be, for example, a polymeric material such as a silicone (e.g., PDMS), an epoxy, a biodegradable polymer, or a thermoplastic. In certain embodiments, the plurality of fibers is provided as a weaved fabric of the hybrid fibers. For example, FIG. 7(b) shows a composite material 784 comprising a weaved fabric 786 of hybrid fibers 700 as described herein embedded in a material 782.

The invention will be further described with reference to the following non-limiting examples.

Example 1

Figure 8:
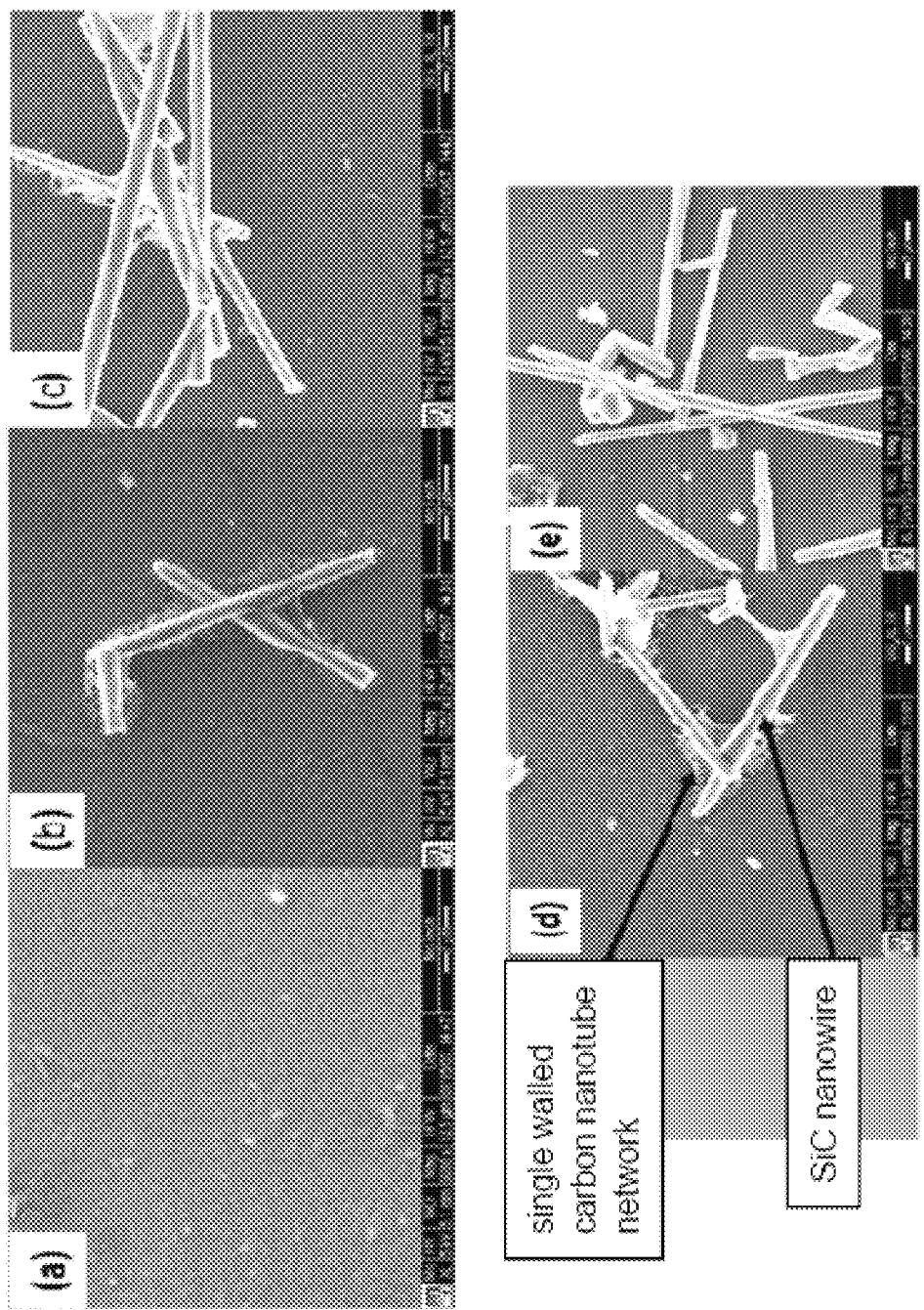
FIG. 8 is a set of SEM micrographs of dried SiC/single walled carbon nanotube suspensions.

Silicon carbide/single walled carbon nanotube hybrid fibers were prepared from N,N-dimethylformamide (DMF) suspension. A cluster of single walled carbon nanotubes (Carbon Nanotechnologies, Inc., Houston, Tex.) was dispersed in DMF with sonication for ten hours. Silicon nanowires (Advanced Composite Materials Corp., Greer, S.C.) were dispersed in DMF in similar fashion. For comparison, five types of suspensions having different SiC nanowire concentrations were prepared: (1) 0 mg/L; (2) 62.5 mg/L; (3) 125 mg/L; (4) 250 mg/L; (5) 250 mg/L. Each of suspensions 1-4 included single walled carbon nanotubes at 120 mg/L. A 2 µL drop of each suspension was dried on a 100 nm thick oxide layer of a silicon wafer; SEM micrographs (FEI Sirloin SEM) are provided in FIG. 8. As shown in FIGS. 8(b), (c) and (d), the single walled carbon nanotubes formed a network with the SiC nanowires such that the single walled carbon nanotubes were disposed on the surfaces of and intercoupled the nanowires. The single walled carbon nanotubes formed fibrils with diameter in the range of 5-10 nm. As the SiC nanowires are chemically inert, the inventors surmise that the network between the single walled carbon nanotubes and the nanowires was maintained by van der Waals interactions.

To fabricate a hybrid fiber, tungsten wires (50 µm in diameter and 5 cm in length) were prepared by tensile fracture. A tungsten wire was pulled until fracture by axial force, creating a tip having an end diameter of about 40 µm. This tip was used to form hybrid fibers, and was suitable for use in a tip array due to its low cost and ease of handling.

Figure 9:
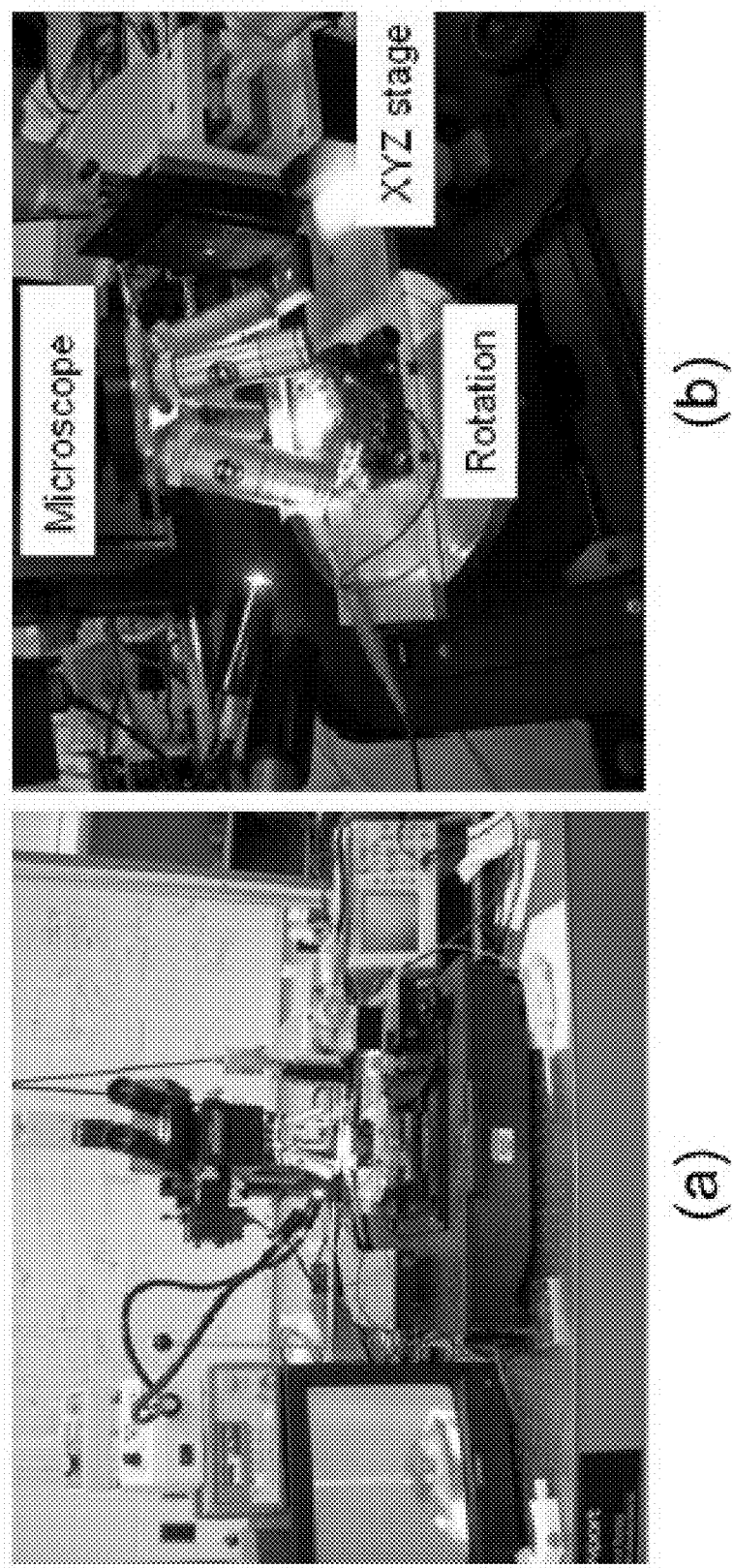
FIG. 9 is a set of pictures of an experimental setup used in fabricating hybrid fibers according to one embodiment of the invention.
Figure 10:
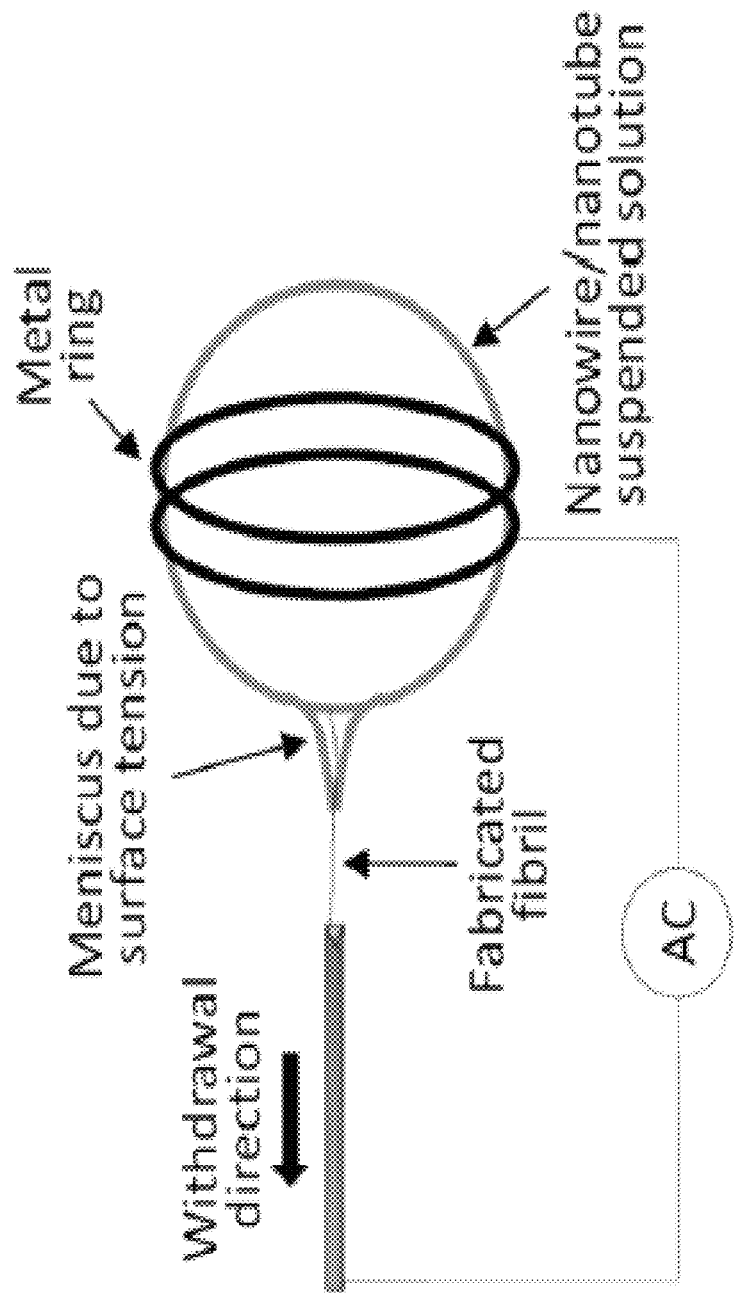
FIG. 10 is a schematic view of a hybrid fiber being drawn.

The experimental setup used in fabricating hybrid fibers was based on an x-y-z stage with rotation under a light microscope, and is shown in FIG. 9. FIG. 9(a) shows the entire experimental setup, with a microscope, a fiber-optic illuminator, an imaging system, a signal generator, and an x-y-z stage. FIG. 9(b) shows the x-y-z stage under the microscope. FIG. 10 is a schematic view of the drawing of the hybrid fiber. A droplet of the suspension of nanowires and binder elements is contained within a small coil of wire. The tungsten tip is dipped into the meniscus of the droplet, and an AC potential is generated (using the signal generator) between the tip and the coil. The tip is then withdrawn slowly, drawing behind it the hybrid fiber.

Hybrid fibers were drawn under various conditions to explore various process parameters.

The ratio between the concentrations of nanowires and hybrid elements can be used to adjust the dimensions, mechanical stiffness and electrical conductivity of a SiC/single walled carbon nanotube hybrid fibers. The mixtures (1)-(5) were used to form fibers using the apparatus of FIG. 9 under identical conditions: The AC voltage was 20 $V_{pp}$ at 5 MHz (57 $mV_{pp}$/µm considering the distance between the tip and the coil), and tips were immersed in a 2 µL droplet at a distance of 100 µm for 30 seconds, then withdrawn at a rate of 16 µm/s.

Figure 11:
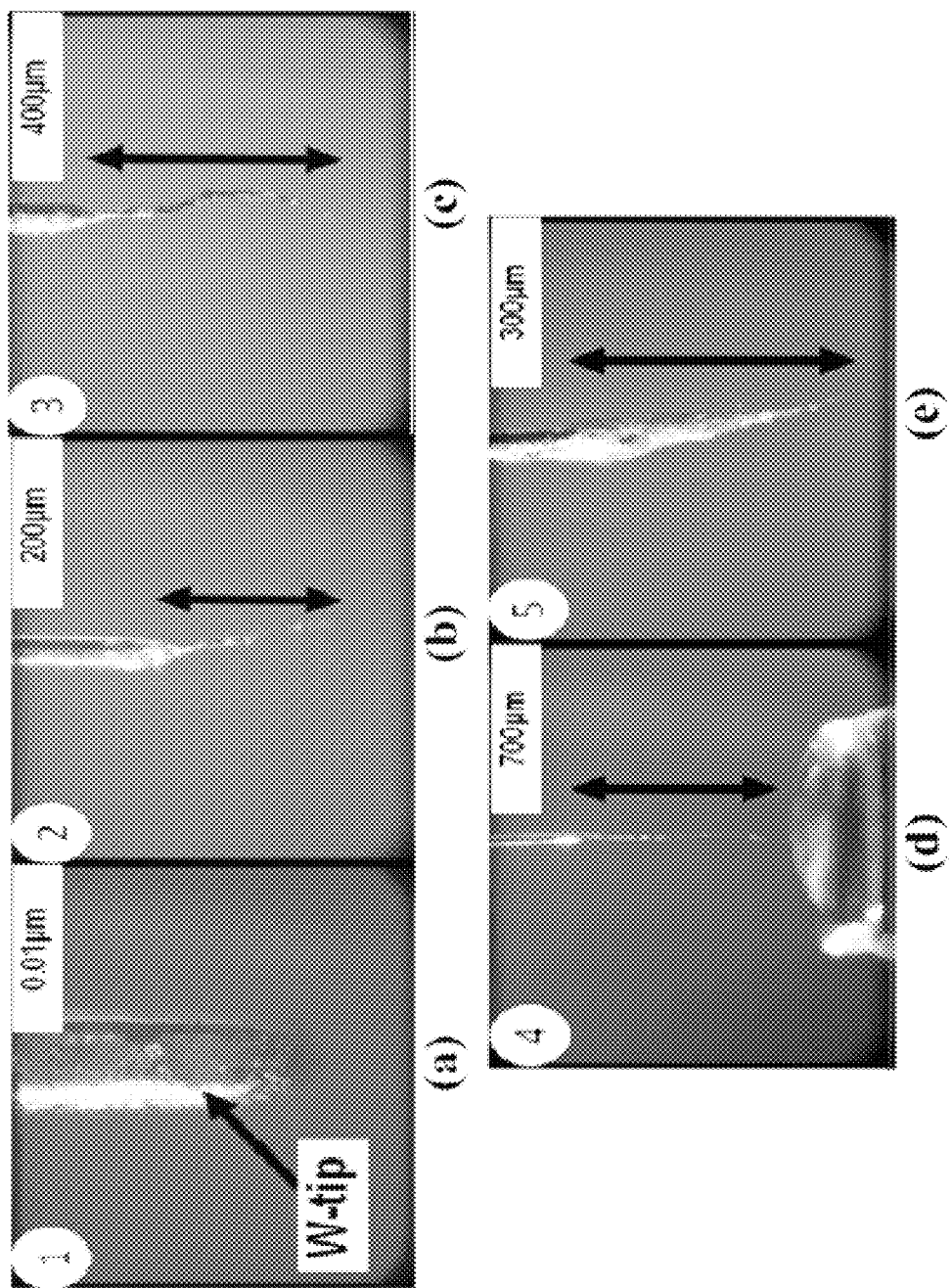
FIG. 11 is a set of microscope pictures of the hybrid fibers made as described in Example 1.
Figure 12:
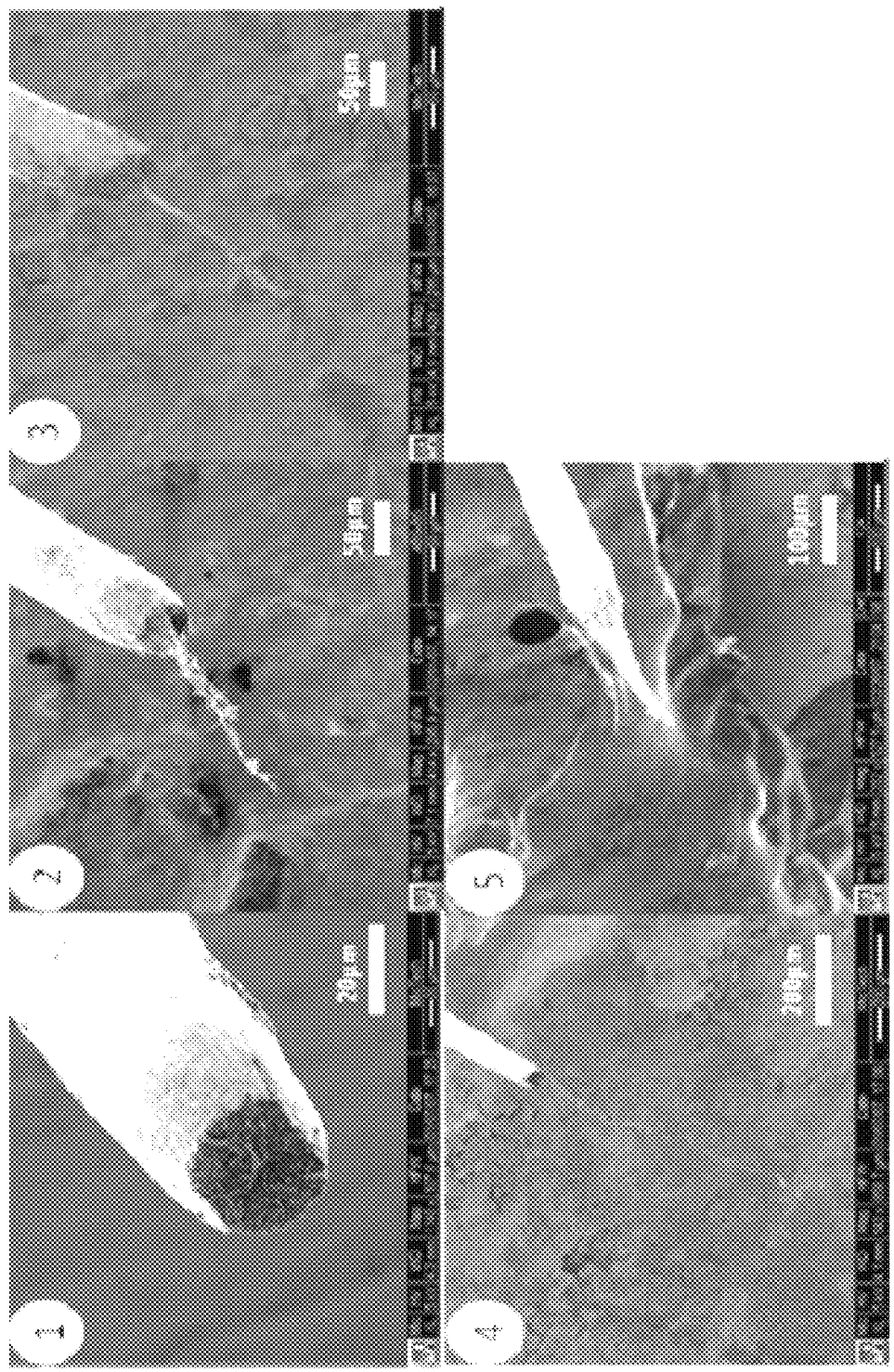
FIG. 12 is a set of SEM micrographs of the hybrid fibers made as described in Example 1.

FIG. 11 presents five pictures from the microscope (with fiber length inset), and FIG. 12 presents five SEM micrographs (1)-(5) showing the results of these experiments. Mixture (1) had only single walled carbon nanotubes in it. FIG. 11(a) shows a tungsten tip having a fibril made only of single walled nanotubes; as the fibril was short (only about 10 nm), only the tungsten tip is visible in the microscope picture. Mixtures (2), (3) and (4) have increasing amounts of nanowires, and therefore increasing ratios of concentrations of nanowires to hybrid elements. The hybrid fibers prepared using these mixtures (shown in FIGS. 11(b)-(d) and 12(2)-(4)) increase in length with increasing concentration of nanowires. In each, the SiC nanowires are covered with single walled carbon nanotubes, and interconnected by bundles of single walled carbon nanotubes. The use of relatively more binder elements in the mixture from which the hybrid fiber is drawn can provide less stiff hybrid fibers, as thicker networks of intercoupling binder elements can provide higher flexibility.

FIGS. 11(e) and 12(5) show the fiber made with mixture (5), which included only nanowires. The fiber diameter decreased rapidly along its length due to the high resistivities of the SiC nanowires; as the fiber reached a length of about 300 µm, the electric field was no longer able to attract more material to the tip of the structure. Moreover, the pure SiC fiber was so fragile that it collapsed under slight vibration.

The immersion time in the mixture of nanowires and binder elements (i.e., before withdrawal) is an important parameter. When immersion time was increased, larger length and diameter SiC/single walled carbon nanotube hybrid fibers can be formed, as more nanowires and binder elements can be attracted to the tip before withdrawal. Without intending to be bound by theory, the inventors surmise that longer immersion times allow more nanowires and binder elements to be attracted to the tip.

The withdrawal rate is directly related to the production speed of hybrid fibers, and is also inversely related to the thickness of the hybrid fibers. The withdrawal rate of 16 μm/s is about 20 fold greater than that possible for the fabrication of fibers of carbon nanotubes. The maximum withdrawal rate is a function of both the approaching velocity of the nanowires to the tip and the lengths of the nanowires. The withdrawal rate should not exceed the approaching velocity of the nanowires induced by the AC electric field. In order to provide a uniformly thick hybrid fiber, the withdrawal rate should be relatively uniform.

Figure 13:
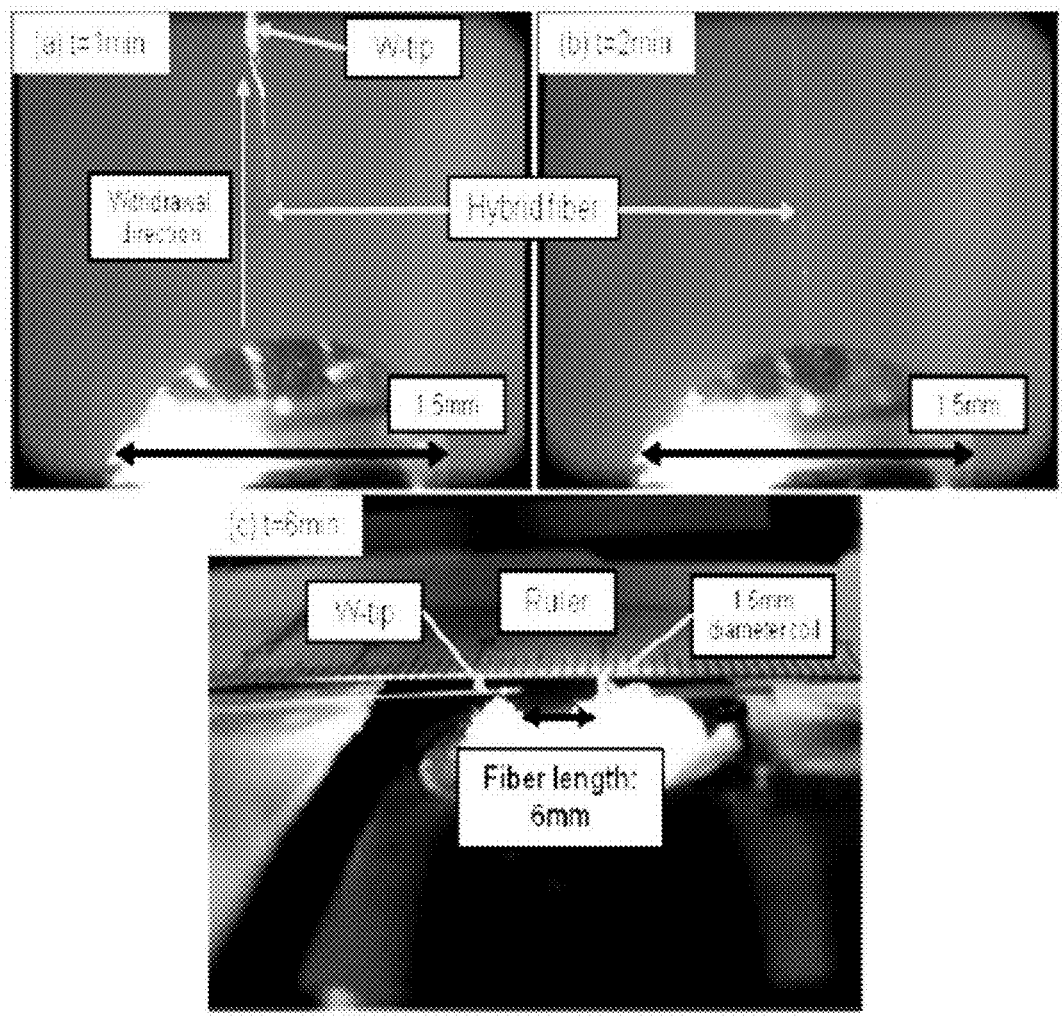
FIG. 13 is a set of microscope pictures of a hybrid fiber prepared as described in Example 1 at three points during drawing.

The amount and concentrations of suspension used in fabrication of a hybrid fiber can impact final hybrid fiber length. For example, a hybrid fiber was drawn as described above from a 2 μL droplet of suspension containing 62.5 mg/L SiC nanowires and 120 mg/L single walled carbon nanotubes. The total mass of material in the suspension was computed (using densities of 3.21 g/mL and 1.33 g/mL for SiC nanowires and single walled carbon nanotubes, respectively) to provide sufficient material to make a fiber having a diameter of 4 μm and a length of 8.67 mm. The drawn hybrid fiber is shown in FIG. 13, after (a), 1 min of drawing; (b) 2 min of drawing; and (c) 6 min of drawing. The hybrid fiber has a length of about 6 mm, showing that a substantial fraction of the material in the droplet was converted to hybrid fiber. Larger or more concentrated droplets can be used to make longer, thicker hybrid fibers.

The electric field can be used to control certain properties of the hybrid fiber. An AC electric field generates a dielectrophoretic force that can attract and orient rod-shaped objects in suspension. Without intending to be bound by theory, the inventors surmise that rod-shaped binder elements such as (single walled carbon nanotubes and nanowires can be selectively attracted by the AC field over unwanted particles. Moreover, the use of the AC electric field can increase the electrical conductivity of the hybrid fiber, as more metallic binder elements (e.g., single walled carbon nanotubes of relatively more metallic character) will be preferentially attracted to the growing hybrid fiber over less metallic binder elements (e.g., single walled carbon nanotubes of relatively more semiconducting character).

Figure 14:
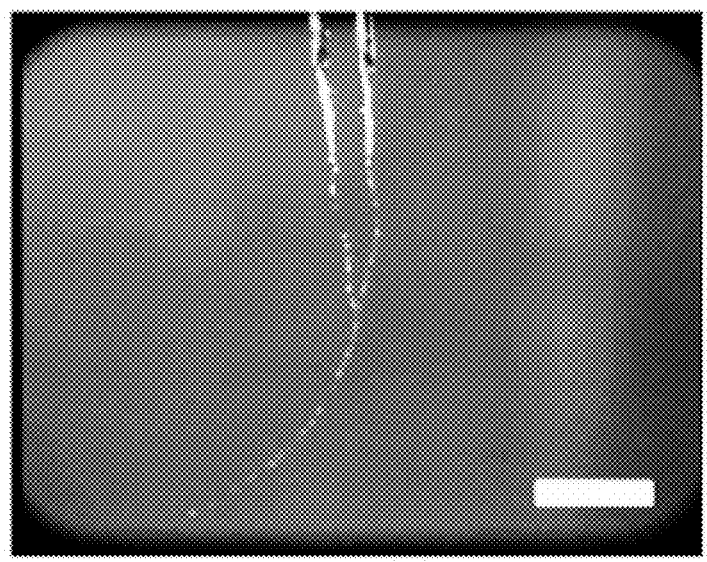
FIG. 14 is a picture of a junction of two hybrid fibers and an I-V graph for the junction.
Figure 14:
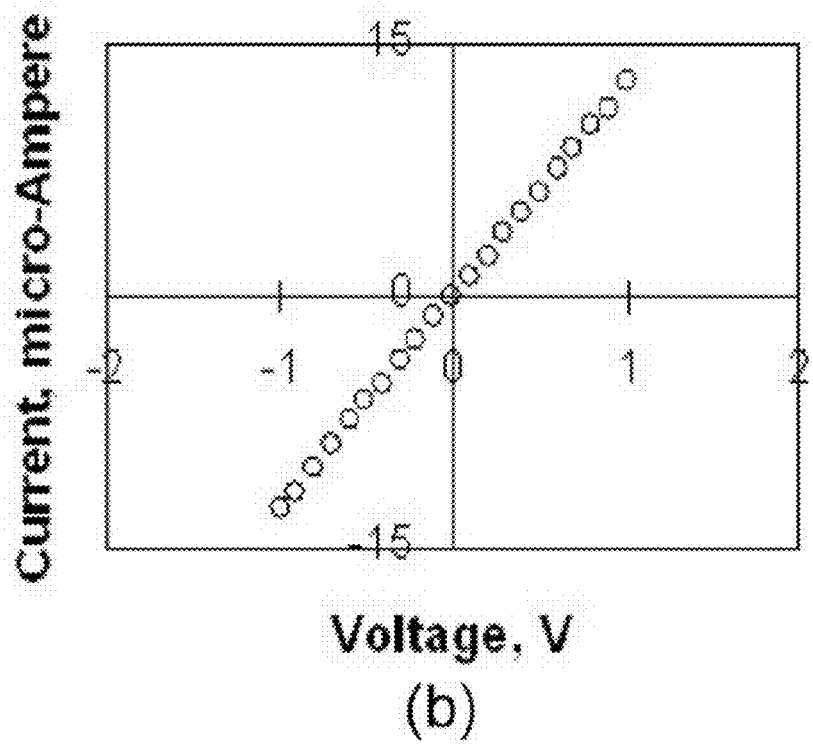

The electrical properties of the hybrid fibers were characterized using an I-V measurement. Two hybrid fibers were produced as described above and connected in a junction via capillary action as shown in FIG. 14(a). The electrical measurement is presented in FIG. 14(b), which demonstrates a linear relationship. Based on the this data, the resistance of the 1.8 mm long hybrid fiber was computed to be about 77 kΩ. Accordingly, the hybrid fiber was electrically conductive.

Figure 15:
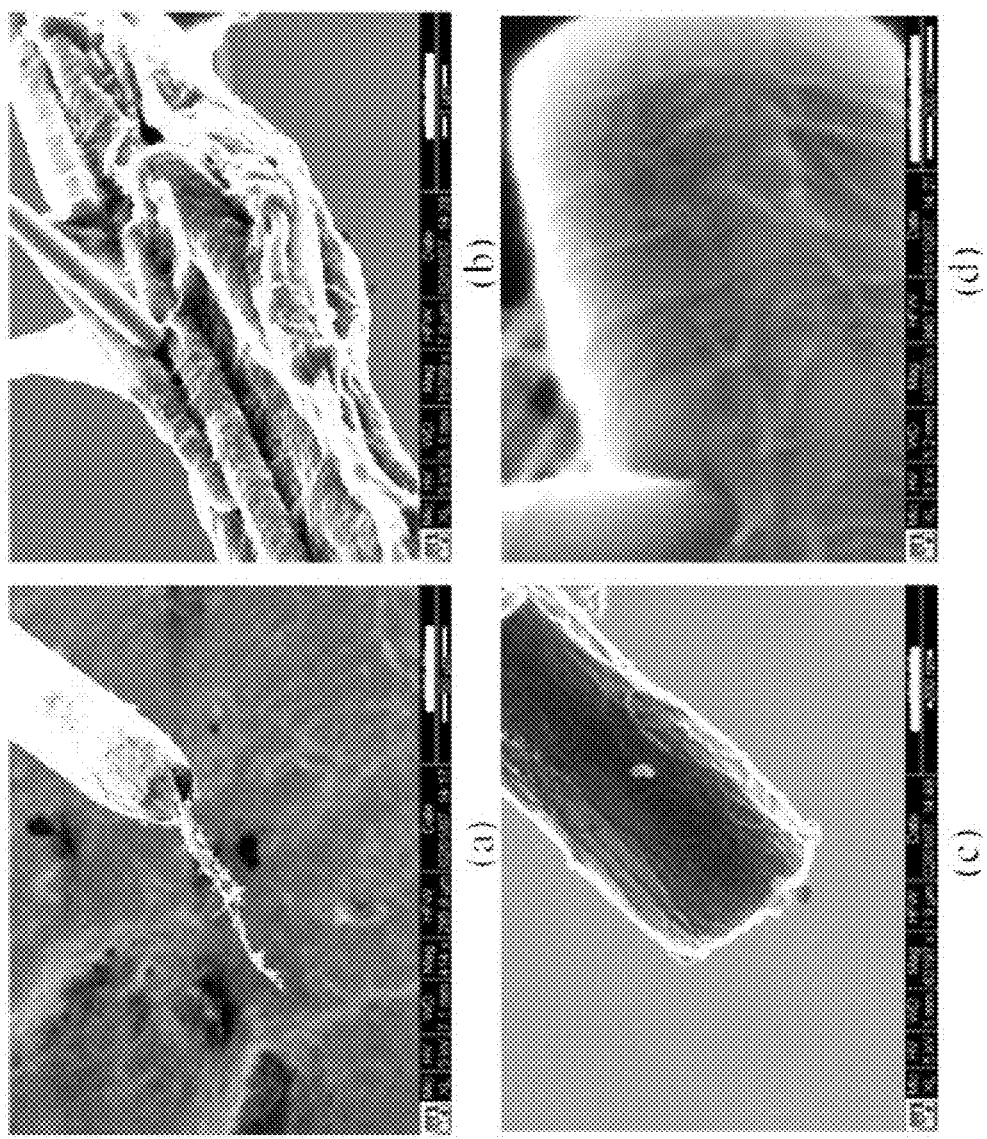
FIG. 15 is set of SEM micrographs of hybrid fibers prepared according as described in Example 1.

SEM micrographs of the hybrid fibers are presented in FIG. 15. FIG. 15(a) shows a hybrid fiber extending from a tungsten tip. FIG. 15(b) shows a close-up of the hybrid fiber, in which the SiC nanowires are coated with and held together by the single walled carbon nanotubes. FIG. 15(c) shows the end of a hybrid fiber terminated in a single nanowire, with single walled carbon nanotubes are oriented along the axis of the tip. When the same suspension was spotted and dried on an oxide layer in the absence of an electric field, the single walled carbon nanotubes are oriented randomly (FIG. 15(d)).

Example 2

Figure 16:
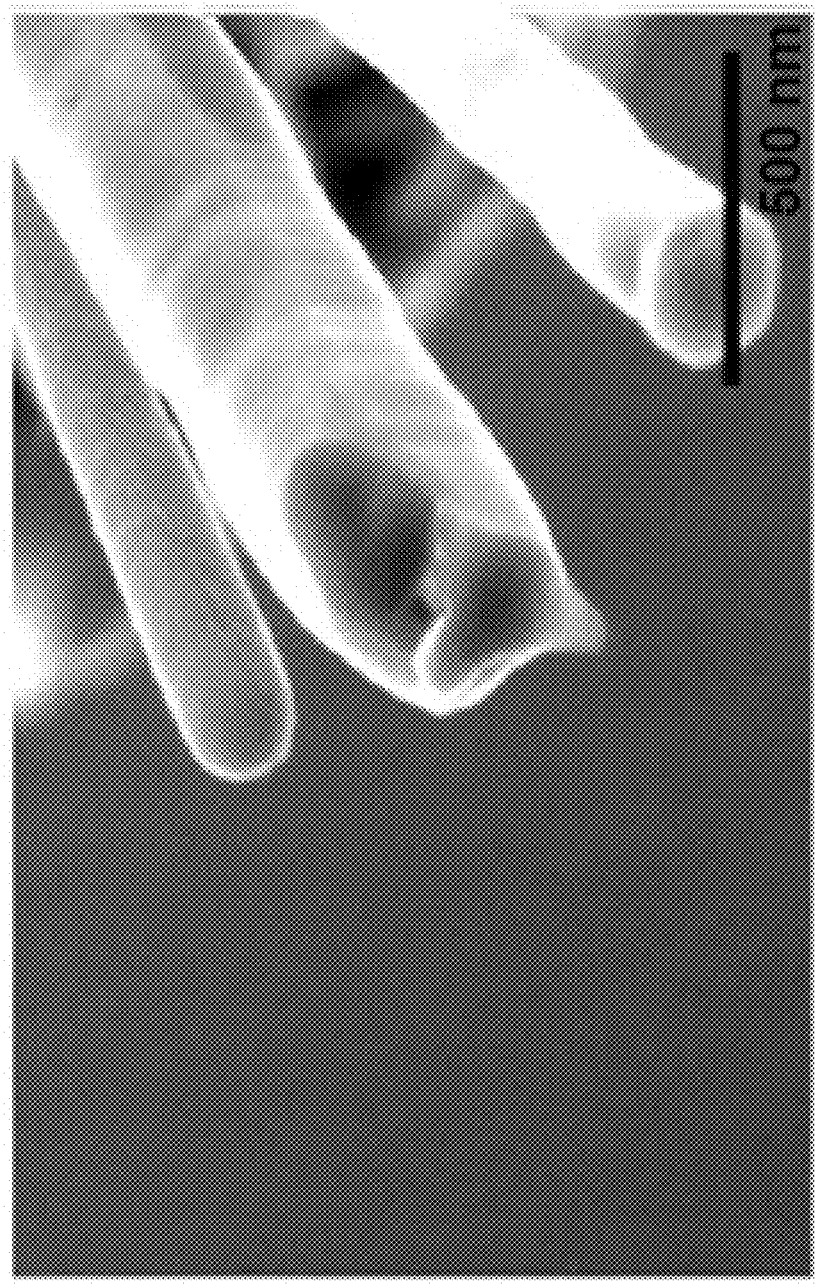
FIG. 16 is a SEM micrograph of a SiC/single walled nanotube/DNA hybrid fiber as described in Example 2.

A SiC/single walled carbon nanotube/DNA hybrid fiber is shown in SEM micrograph view in FIG. 16. The concentration of the λ-phage DNA solution was 1 μg/mL in TRIS EDTA buffer (pH 7.5). To fabricate λ-DNA hybrid fiber, the free end of a SiC/single walled carbon nanotube hybrid fiber was dipped in a 2 μL solution drop, which was hung in a metal coil. An AC potential of 20 $V_{pp}$ at 5 MHz was applied to the coil and the nanotip in order to induce a DEP force. After one minute of the immersion, the nanotip was withdrawn at the rate of 8 μm/s. The captured DNA on the free end of the hybrid fiber was investigated by an SEM. This hybrid fiber has smoother surface than the corresponding SiC/single walled carbon nanotube hybrid fiber, evidencing the collection of DNA into any interstices between the nanowires and the single walled carbon nanotubes. The DNA can also serve as binding elements. Collected DNA can be used, for example, as a DNA probe in sensing applications.

Example 3

Figure 17:
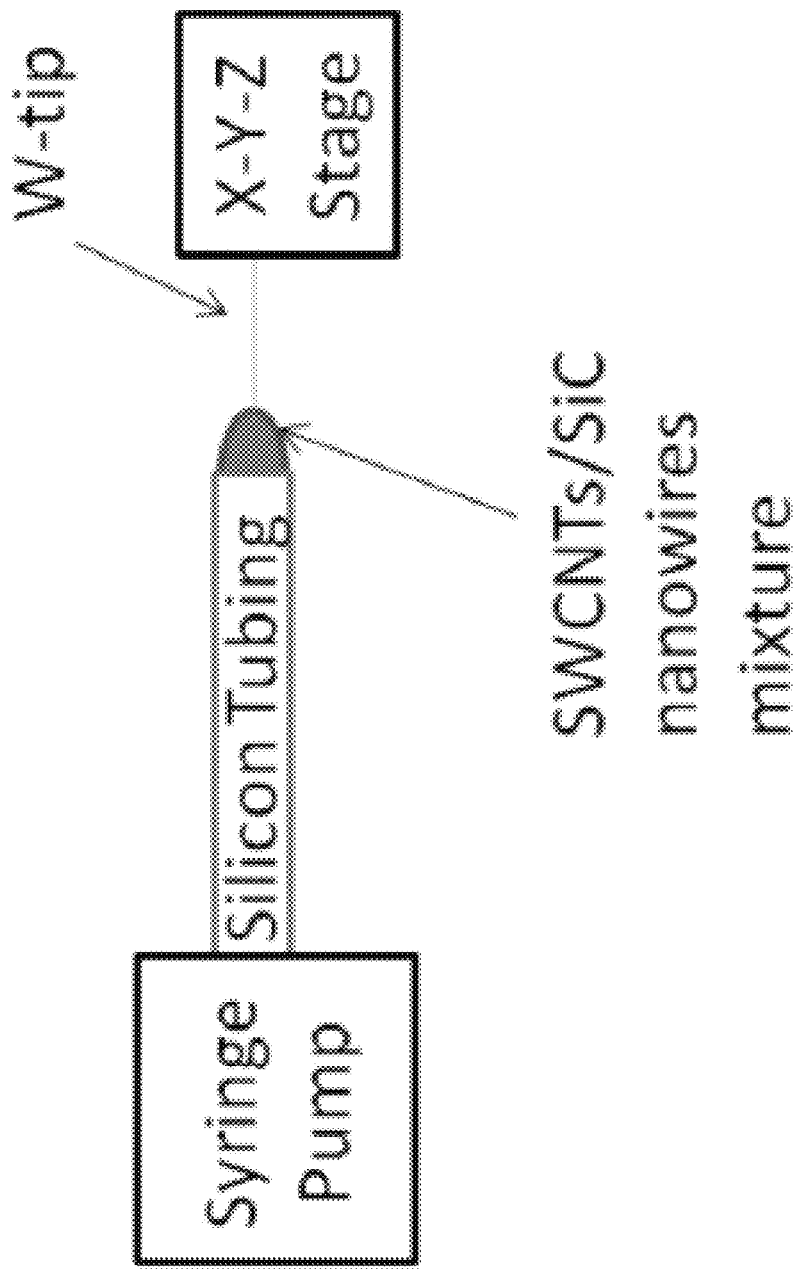
FIG. 17 is a schematic view of the experimental setup used in fabricating hybrid fibers as described in Example 3.
Figure 18:
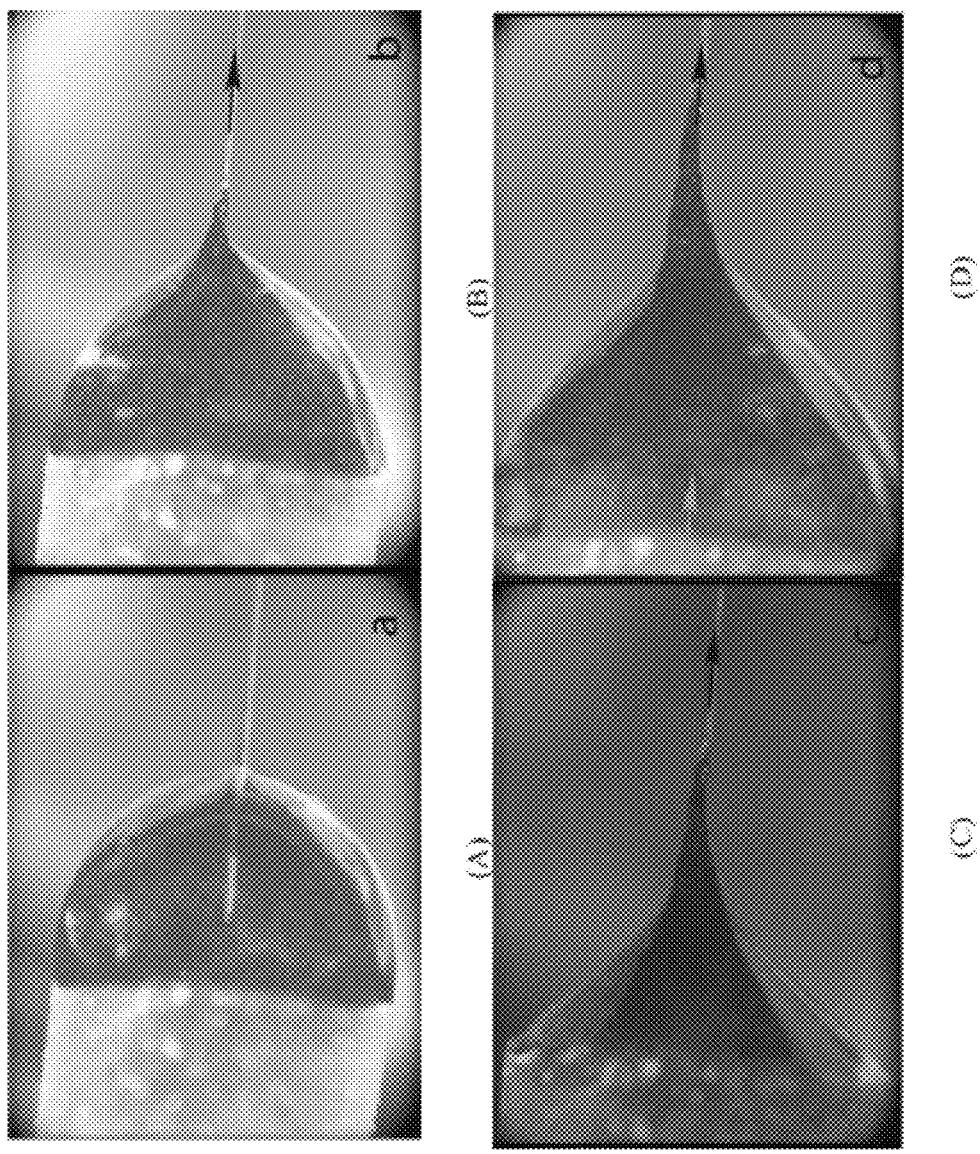
FIG. 18 is a set of pictures demonstrating the hybrid fiber fabrication process of Example 3.
Figure 19:
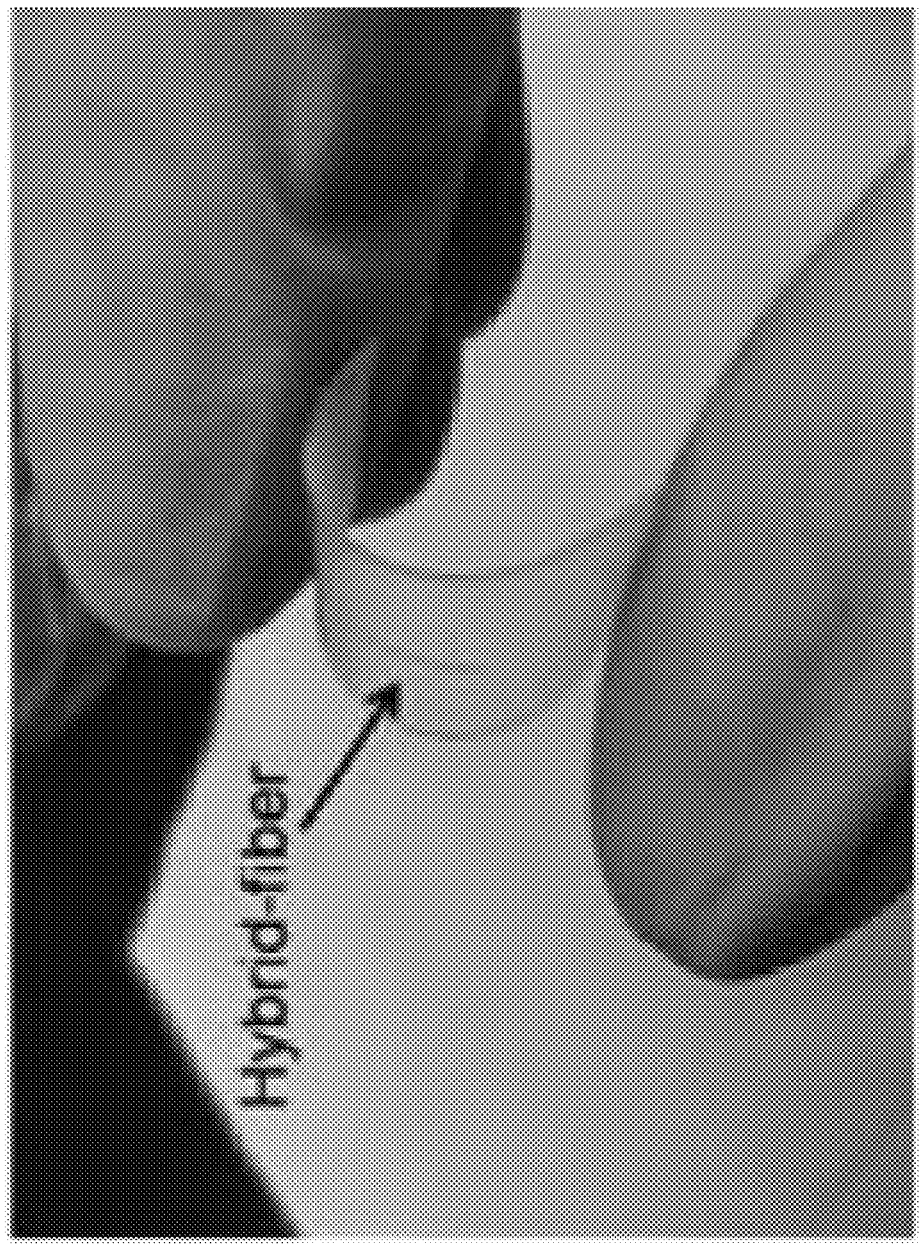
FIG. 19 is a picture of a hybrid fiber embedded in a PDMS matrix as described in Example 3.

A hybrid fiber was drawn using the method described above with respect to FIG. 5. A schematic view of the experimental setup is provided in FIG. 17. A DMF suspension having 120 mg/L single walled carbon nanotubes and 250 mg/L of SiC nanowire was sucked into the silicon tubing (0.058" i.d.×0.076" o.d.) suing a syringe pump (Pump 11 Pico Plus, Harvard Apparatus Inc., Holliston, Mass.). An x-y-z manipulator was used to position a tungsten tip (as described above) at the end of the silicon tubing, then the syringe pump was used to push a small amount of the suspension out of the tube, forming a semispherical meniscus at the end of the tube. The tungsten tip was then immersed into the suspension, FIG. 18(a). After about 5-10 minutes, the DMF had begun to evaporate, and SiC/single walled carbon nanotubes began to attach themselves to the tungsten tip, FIG. 18(b). The DMF solvent was allowed to further gradually evaporate, and the tungsten tip was withdrawn from the mixture, FIG. 18(c). The syringe pump was used to replenish the droplet from the silicon tube, FIG. 18(d). The steps of FIG. 18(b)-(d) were repeated to form the hybrid fiber. In this process, the suspension is continuously supplied through the tubing, and therefore the ultimate hybrid fiber length is not limited by the volume of the suspension droplet. Using this process, an 8 mm long hybrid fiber was fabricated after 30 minutes of drawing. The fiber was embedded in a PDMS polymer matrix, as shown in FIG. 19.

Example 4

Figure 20:
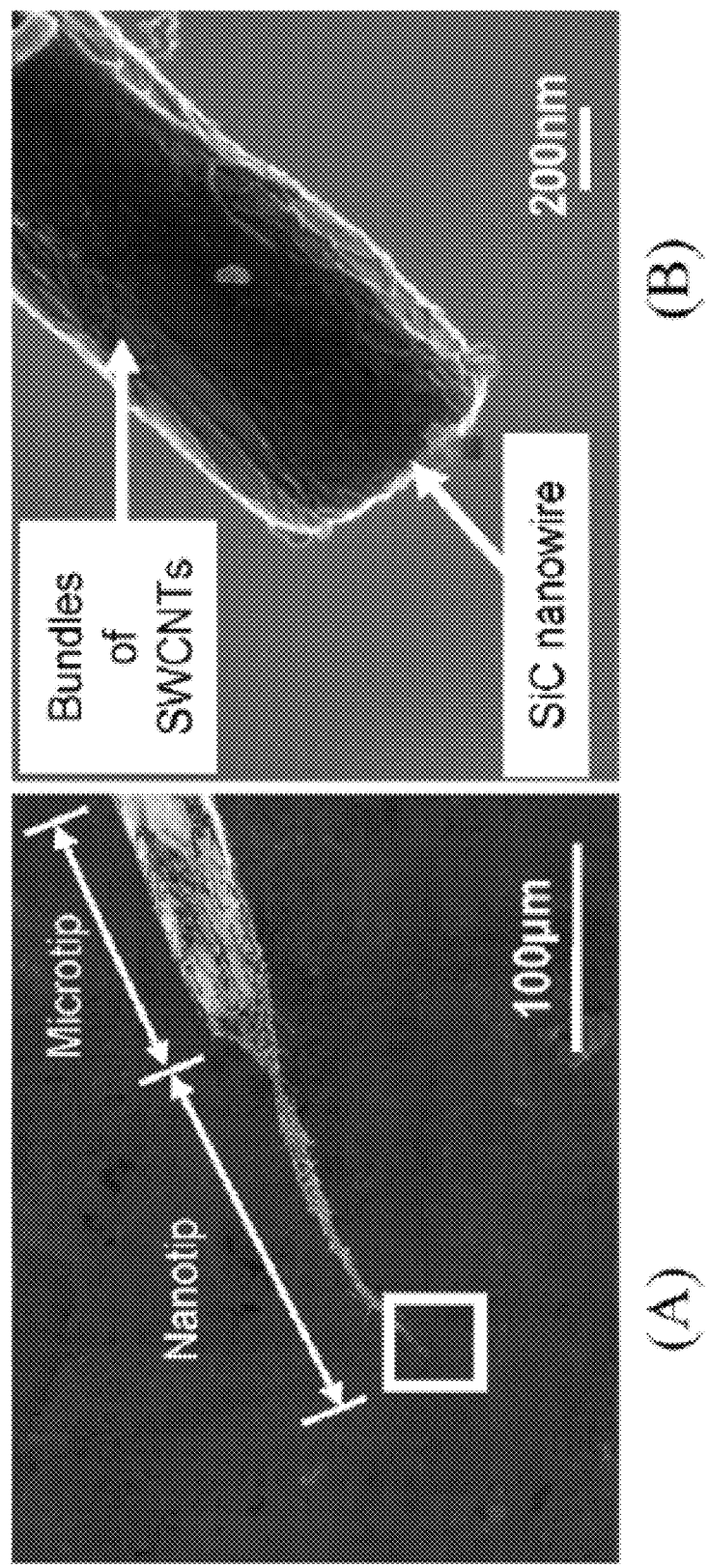
FIG. 20 is a set of SEM micrographs of the hybrid fibers used in the experiments of Example 4.

A gold plated tungsten microwire (50 μm diameter) was fractured with tension to form a tip. 2 μL of a sonicated mixture of SiC nanowires (200 mg/L) and single walled carbon nanotubes (100 mg/L) was held in a silver-plated copper coil by surface tension, and the tip was immersed into the mixture with an AC potential (20 $V_{pp}$ at 5 MHz) between the tip and the coil, as described above. The tip was withdrawn at a rate of 8 m/s, thereby forming a hybrid fiber nanotips, SEM micrographs of which are presented in FIG. 20. The hybrid fiber nanotip terminated with a single SiC nanowire coated with single walled carbon nanotubes, FIG. 20(b). The average diameter of nanotips created in this manner was 544 nm (141 nm std. dev.).

Figure 21:
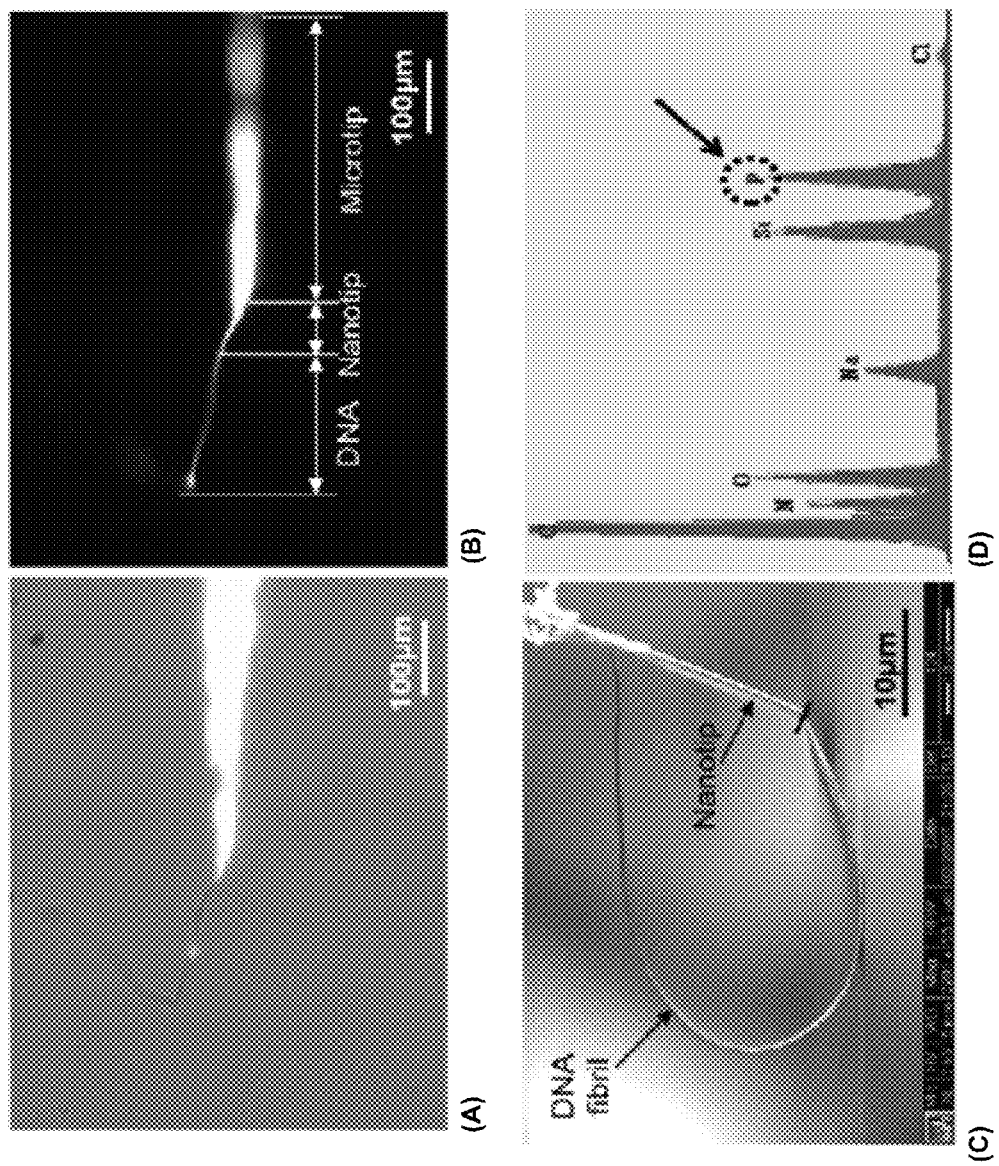
FIG. 21 is a set of images and an EDS analysis of a fibril of DNA collected as described in Example 4.

Using a nanotip with an AC field, a λ-DNA fibril was fabricated onto the tip by dielectrophoresis and capillary action. A 500 μg/mL suspension of DNA (16 nM, molecular weight 31.5 MDa) in TRIS-EDTA buffer was prepared. To concentrate λ-DNA, the nanotip was dipped in a 2 μL droplet of the DNA suspension, held in the coil, as described above. An AC potential of 20 $V_{pp}$ at 5 MHz was applied between the coil and the nanotip to induce a dielectrophoretic force, which attracted the DNA molecules to the nanotip. After 1 minute of immersion under field, the nanotip was withdrawn at the rate of 8 μm/s. Due to the high concentration of collected DNA, the molecules formed a fibril by the capillary force when the tip was withdrawn from the suspension. The DNA captured on the nanotip was investigated using an epi-fluorescence microscope, SEM, and the energy dispersive spectrometer of the SEM. For the fluorescence observation, PicoGreen dsDNA reagent (a green fluorophoric intercalating dye, excitation ~480 nm, emission~Invitrogen, Carlsbad, Calif.) was mixed with the DNA before collection. FIG. 21 shows the captured DNA on the nanotip as a ~400 μm long DNA fibril. FIG. 21(a) is an optical microscope image, FIG. 21(b) is the corresponding fluorescence microscope image, and FIG. 21(c) is an SEM image. EDS analysis of the captured DNA is shown in FIG. 21(d). Notably, the EDS shows a strong signal for phosphorus, an element not present in any other material in the experiment other than DNA. Phosphorus was not detected in any control samples, including the buffer, pure water, the fluorescence dye, and the bare hybrid fiber nanotip, suggesting that the fibril contains DNA.

Unless clearly excluded by the context, all embodiments discloses for one aspect of the invention can be combined with embodiments disclosed for other aspects of the invention, in any suitable combination.

It will be apparent to those skilled in the art that various modifications and variations can be made to the present invention without departing from the scope of the invention. Thus, it is intended that the present invention cover the modifications and variations of this invention provided they come within the scope of the appended claims and their equivalents.

What is claimed is:
1. A method for preparing a hybrid fiber, comprising
   (a) inserting a tip into a surface of a suspension comprising
       (i) a plurality of nanowires, each nanowire having a length, a width, and a thickness, the length being at least 10 times the width and at least 10 times the thickness;
       (ii) a plurality of binder elements, each binder element having a length, a width, and a thickness, each substantially smaller than the average length of the nanowires and at least one of which is less than about 10 nm in dimension, wherein the binder elements are formed from a material that is electrically conductive; and
       (iii) a solvent;
   wherein the suspension is contained within one or more electrodes; and
   (b) drawing the tip from the surface of the suspension, thereby pulling the hybrid fiber from the suspension; wherein the tip is electrically conductive, and wherein an electric potential is provided between the tip and the one or more electrodes during the drawing.

2. The method according to claim 1, wherein an electric potential is provided between the tip and the one or more electrodes during the drawing.

3. The method according to claim 2, wherein the electric potential comprises an AC potential.

4. The method according to claim 1, wherein the suspension of the nanowires and the binder elements in the solvent is provided in a tube having a first end, from which the suspension protrudes, thereby forming the surface, and wherein the hybrid fiber is drawn from the surface of the suspension, and wherein the suspension is replenished at the first end of the tube by pumping suspension from a second end of the tube.

5. The method according to claim 1, wherein the tip is drawn at a rate in the range of 1 μm/s to 100 μm/s.

6. The method according to claim 1, wherein at least five minutes are allowed to elapse between the inserting of the tip and the drawing of the tip.

7. The method according to claim 1, wherein the nanowires are formed from silicon carbide.

8. The method according to claim 1, wherein the binder elements include carbon nanotubes, carbon nanoparticles, graphene or combinations thereof.

9. The method according to claim 1, wherein the binder elements include nucleic acids, peptides, viruses, polysaccharides, polyphenols, polylipids, cells, or combinations thereof.

10. The method according to claim 1, wherein the binder elements include a combination of carbon nanotubes, carbon nanoparticles or graphene; and nucleic acids, peptides, viruses, polysaccharides, polyphenols, polylipids, or cells.

11. The method according to claim 1, wherein the binder elements are formed from a material that is thermally conductive, photoelectric, piezoresistive, piezoelectric, semiconducting or ferromagnetic.

12. The method according to claim 1, further comprising annealing the hybrid fiber after formation.

* * * * *